(12) United States Patent
Wu et al.

(10) Patent No.: US 12,347,497 B2
(45) Date of Patent: Jul. 1, 2025

(54) NAND EARLY ERASE TERMINATION BASED ON LEAKAGE CURRENT TEST

(71) Applicant: Western Digital Technologies, Inc., San Jose, CA (US)

(72) Inventors: Yuanyuan Wu, Shanghai (CN); Xiaochen Zhu, Milpitas, CA (US); Lito De La Rama, San Jose, CA (US); Suanbin Loh, San Jose, CA (US); Heguang Li, Newark, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 527 days.

(21) Appl. No.: 17/939,795

(22) Filed: Sep. 7, 2022

(65) Prior Publication Data

US 2024/0079066 A1 Mar. 7, 2024

(51) Int. Cl.
*G11C 16/16* (2006.01)
*G11C 11/56* (2006.01)
(Continued)

(52) U.S. Cl.
CPC .......... *G11C 16/16* (2013.01); *G11C 11/5635* (2013.01); *G11C 16/24* (2013.01); *G11C 16/3445* (2013.01); *G11C 29/08* (2013.01); *G11C 29/50* (2013.01); *G11C 2029/5006* (2013.01); *G11C 2211/5648* (2013.01)

(58) Field of Classification Search
CPC ..... G11C 16/16; G11C 11/5635; G11C 16/24; G11C 16/3445; G11C 29/08; G11C 29/50; G11C 2029/5006; G11C 2211/5648; G11C 16/08; G11C 16/32; G11C 16/3418; G11C 16/0483; G11C 16/3427
See application file for complete search history.

(56) References Cited

U.S. PATENT DOCUMENTS 5,615,148 A 3/1997 Yamamura
9,293,205 B2 3/2016 Lee
(Continued)

OTHER PUBLICATIONS

Non-final Office Action dated Jan. 3, 2025, U.S. Appl. No. 18/356,786, filed Jul. 21, 2023.
(Continued)

*Primary Examiner* — Donald H B Braswell
(74) *Attorney, Agent, or Firm* — Pearl Cohen Zedek Latzer Baratz LLP

(57) ABSTRACT

Technology is disclosed herein for early erase termination as a counter-measure for erase disturb. Multiple erase blocks of NAND memory cells are erased in parallel during an erase procedure. Erasing multiple erase blocks in parallel can place considerable strain on the circuitry that generates the erase voltage. If there is significant leakage current in one of the erase blocks the magnitude of the erase voltage for all of the erase blocks may drop. The erase blocks are tested sequentially for leakage current during the first erase loop while the erase voltage is applied to only the erase block under test. If any erase block fails the leakage current test that erase block is removed from the erase procedure. One or more additional erase loops are then performed with only those erase blocks that passed the leakage current test simultaneously receiving an erase voltage, thereby preventing erase disturb with early termination.

18 Claims, 19 Drawing Sheets

(51) Int. Cl.
*G11C 16/24* (2006.01)
*G11C 16/34* (2006.01)
*G11C 29/08* (2006.01)
*G11C 29/50* (2006.01)

(56) References Cited

U.S. PATENT DOCUMENTS

| | | |
|---|---|---|
| 9,449,694 B2 | 9/2016 | Paudel et al. |
| 9,484,104 B2 | 11/2016 | Lee et al. |
| 9,529,663 B1 | 12/2016 | Srinivasan et al. |
| 9,934,872 B2 | 4/2018 | Magia et al. |
| 10,008,276 B2 | 6/2018 | Huynh et al. |
| 2015/0117112 A1 | 4/2015 | He |
| 2016/0232985 A1 | 8/2016 | Sabde et al. |
| 2017/0125107 A1 | 5/2017 | Hong |
| 2021/0074338 A1* | 3/2021 | Khakifirooz ....... G11C 16/3431 |
| 2021/0398604 A1 | 12/2021 | Li et al. |
| 2022/0102224 A1* | 3/2022 | An .................. H01L 23/31 |
| 2023/0025237 A1* | 1/2023 | Lee .................. G11C 16/30 |
| 2024/0071533 A1* | 2/2024 | Liu .................. G11C 16/0483 |
| 2024/0161858 A1 | 5/2024 | Amin et al. |

OTHER PUBLICATIONS

Response to Office Action dated Feb. 12, 2025, U.S. Appl. No. 18/356,786, filed Jul. 21, 2023.

Notice of Allowance dated Mar. 6, 2025, U.S. Appl. No. 18/356,786, filed Jul. 21, 2023..

* cited by examiner

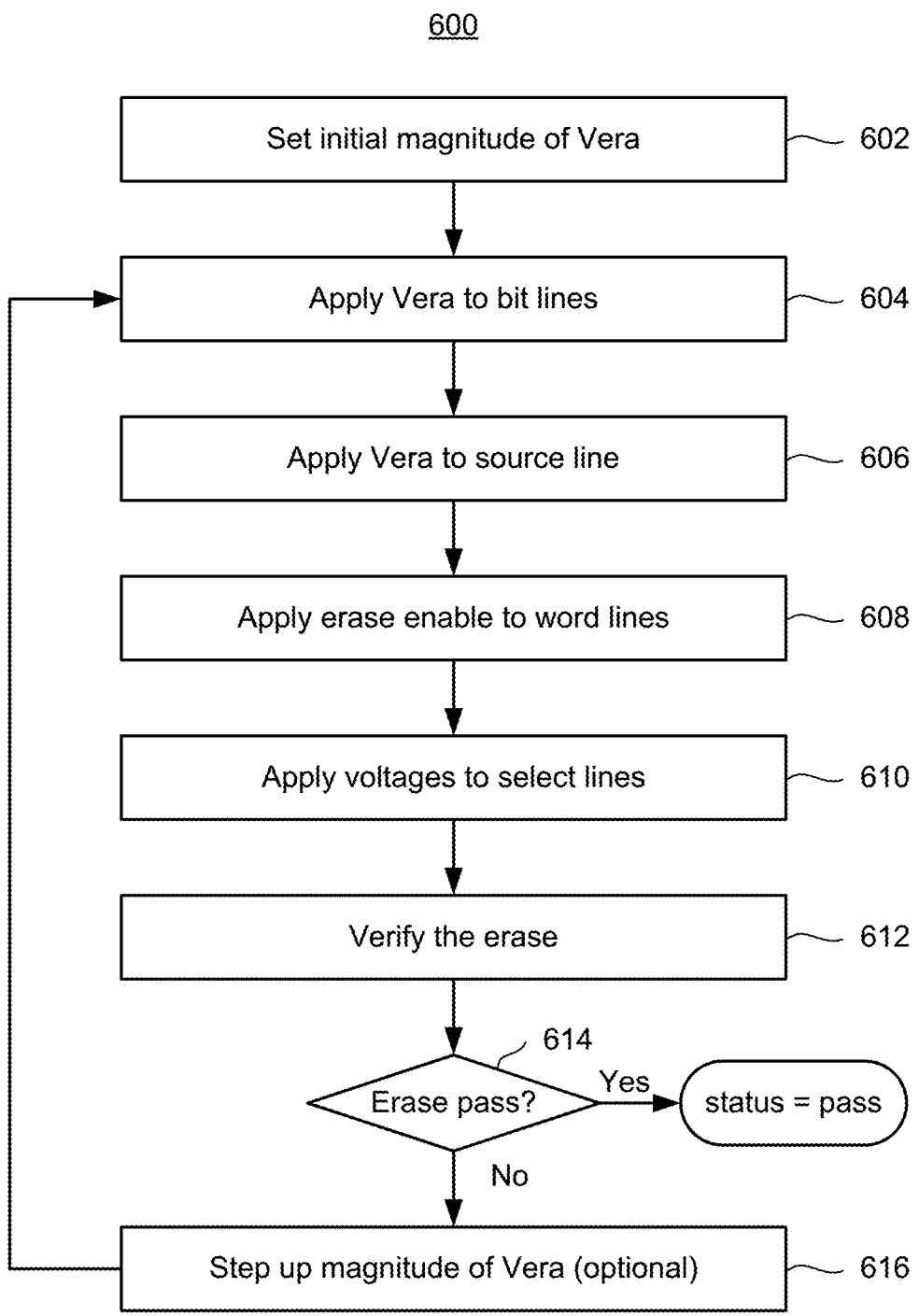

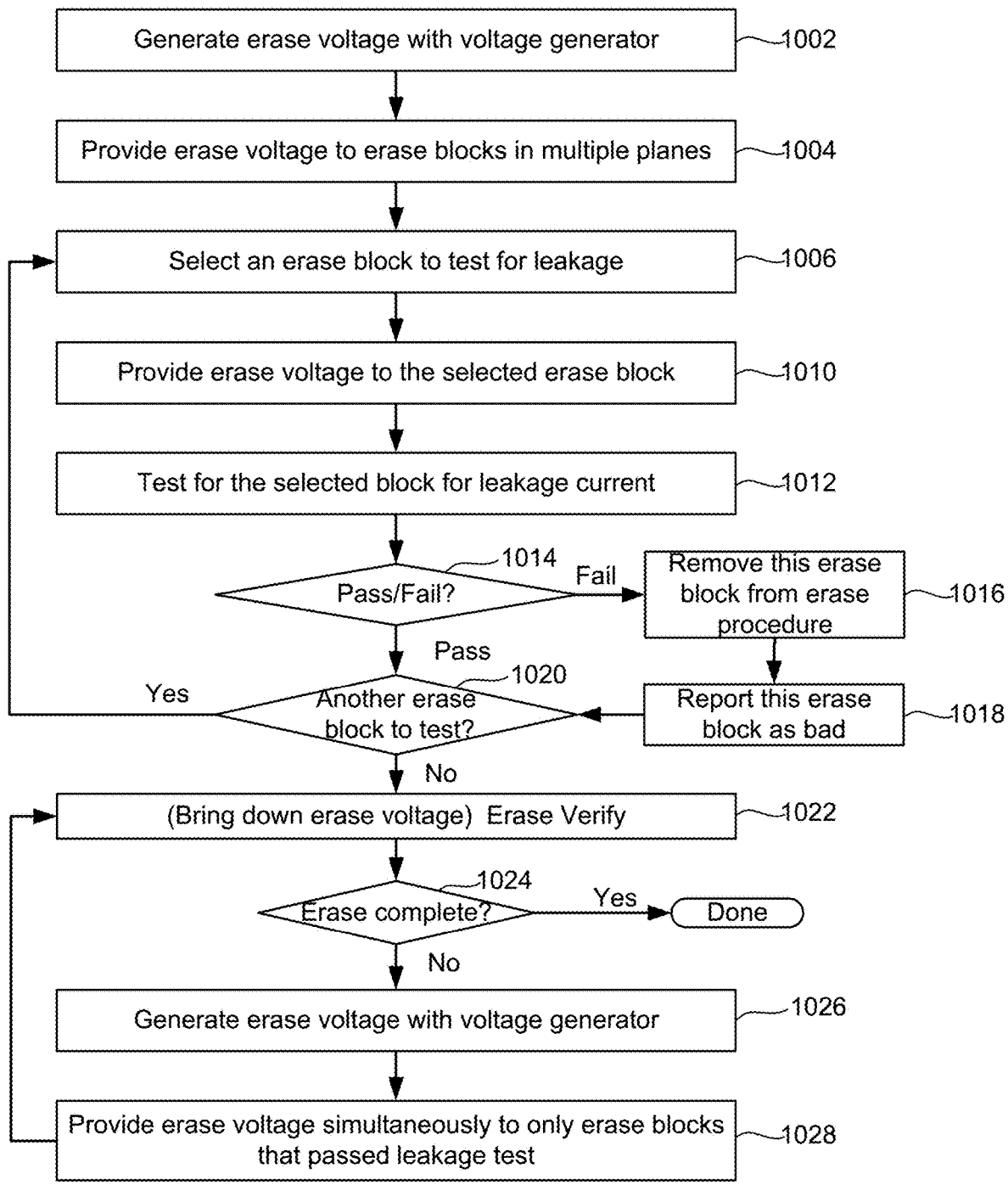

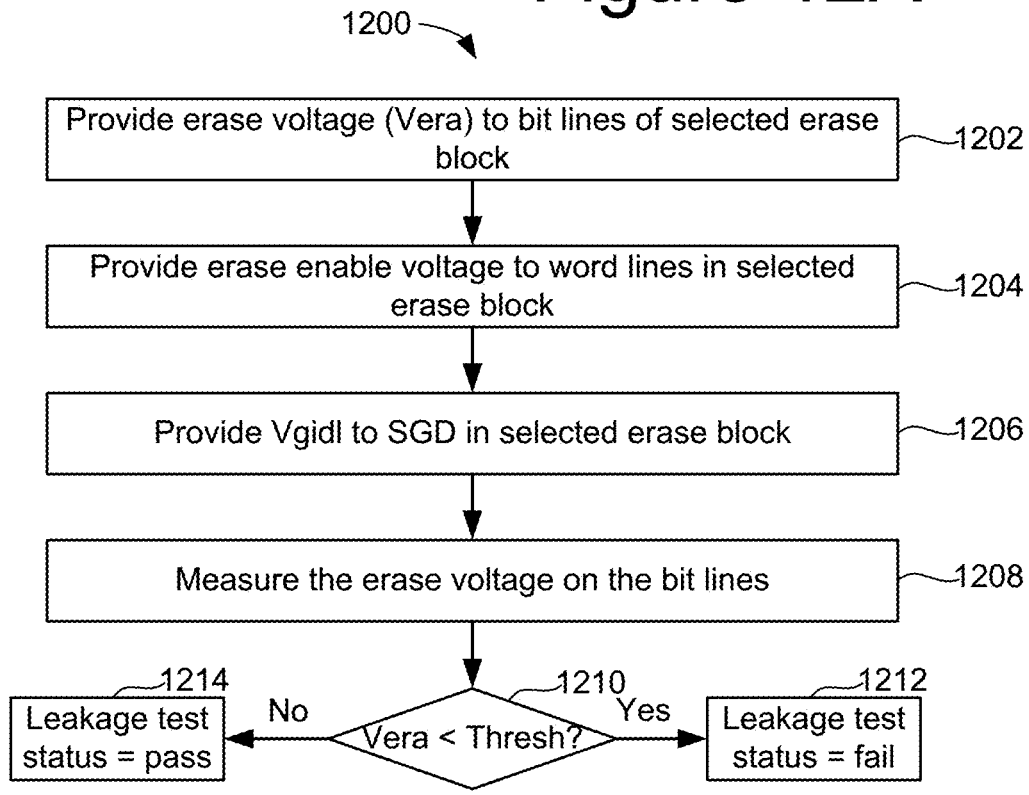
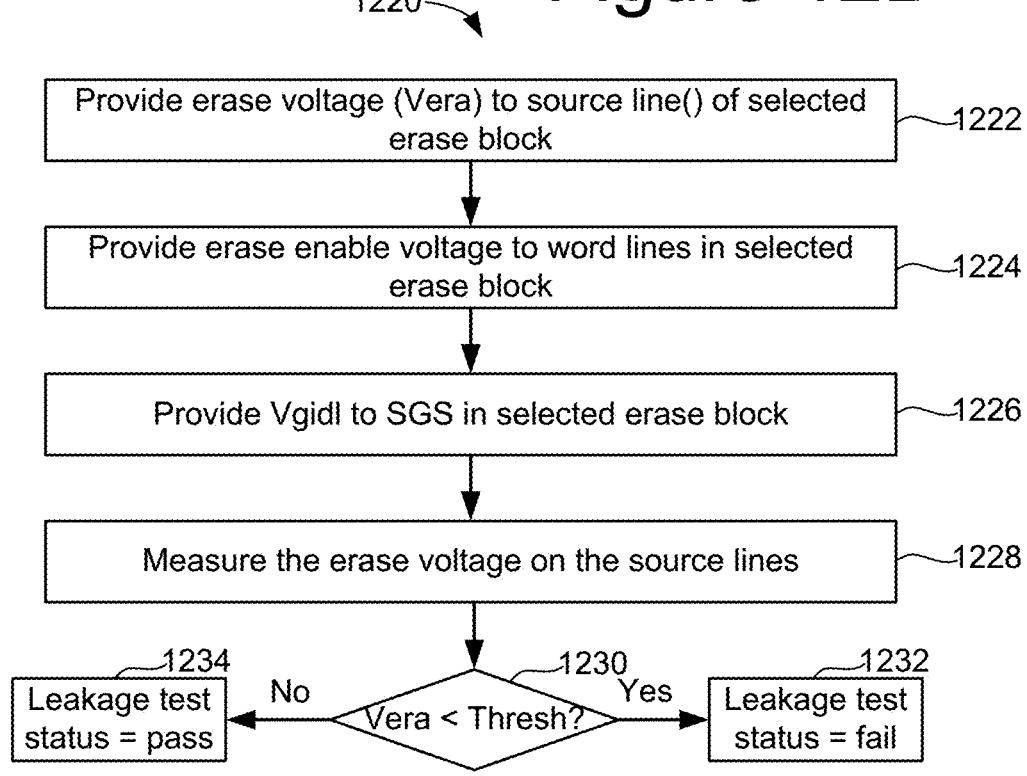

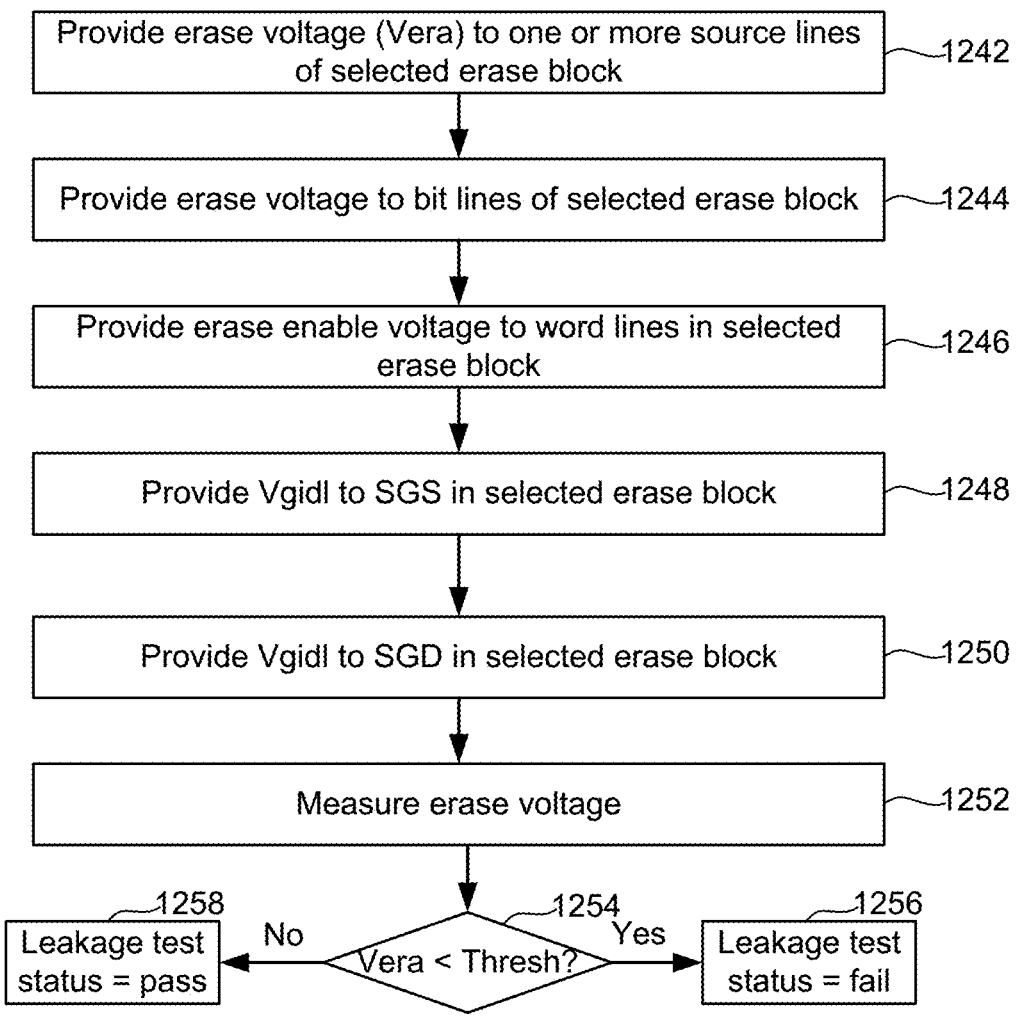

NAND EARLY ERASE TERMINATION BASED ON LEAKAGE CURRENT TEST

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has word lines that provide voltages to the control gates of the memory cell transistors. In some architectures, each word line connects to the control gate of one memory cell on each respective NAND string in the block. A portion of the word line that is adjacent to the memory cell may be considered to be the control gate of that cell.

The non-volatile memory cells may be programmed to store data. Typically, the memory cells are programmed to data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some types of memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

Prior to programming NAND memory cells the memory cells are erased. Erasing the memory cells will typically lower the Vt of each memory cell that is not already below an erase verify reference voltage. Typically, many memory cells are erased at the same time. The term "erase block" or "erase group" may be used herein to refer to a group of NAND memory cells that share word lines and are erased together. It is also possible to erase multiple erase blocks together, such as one erase block on each plane on a memory die. However, such erase procedures may place a considerable strain on the voltage generator that provides the erase voltage.

Defects may exist in the memory structure following manufacturing. For example, there could be a short circuit between a word line and a channel of a NAND string. There could be a short circuit between two word lines. There could be a short circuit between a word line and conductive line that provides a voltage to a source line. Such defects may develop in the memory structure over time. Such defects can result in dysfunction of memory operations such as erase.

BRIEF DESCRIPTION OF THE DRAWINGS

Like-numbered elements refer to common components in the different figures.

FIG. 6 is a flowchart describing one embodiment of a process for erasing memory cells.

FIG. 10 is a flowchart of one embodiment of a process of parallel erase of multiple erase blocks with early termination of erase in an erase block having leakage current.

FIGS. 12A, 12B, and 12C depict flowcharts of various embodiments of testing a selected erase block for leakage current.

DETAILED DESCRIPTION

Technology is disclosed herein for early erase termination as a counter-measure for erase disturb. The erase disturb may occur in a set of erase blocks due to leakage current in another erase block during a parallel erase of multiple erase blocks. In one embodiment, multiple erase blocks of NAND memory cells are erased in parallel during an erase procedure having multiple loops. Each erase block could be in a different plane. Erasing multiple erase blocks in parallel can place considerable strain on the circuitry that generates an erase voltage that is provided to the erase blocks. If there is significant leakage current in one of the erase blocks the magnitude of the erase voltage for all of the erase blocks may drop. In an embodiment, the erase blocks are tested sequentially for leakage current during the first erase loop while the erase voltage is applied to only the erase block under test. The testing may include applying the erase voltage separately to NAND channels in each erase block in sequence. If any erase block fails the leakage current test that erase block is removed from the erase procedure. One or more additional erase loops are then performed with only those erase blocks that passed the leakage current test simultaneously receiving an erase voltage. Therefore, erase disturb is prevented in the one or more additional erase loops.

Figure 1:
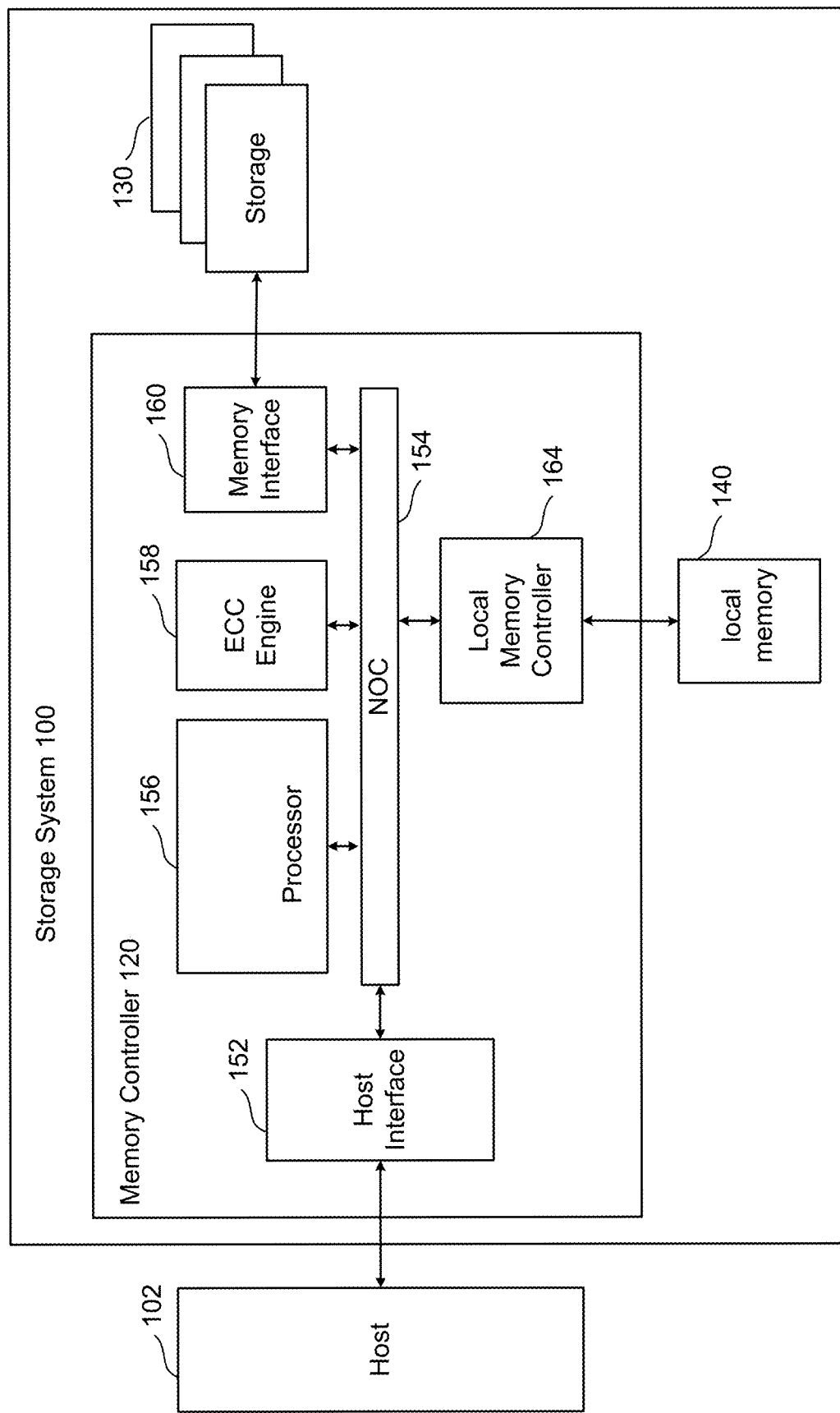
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
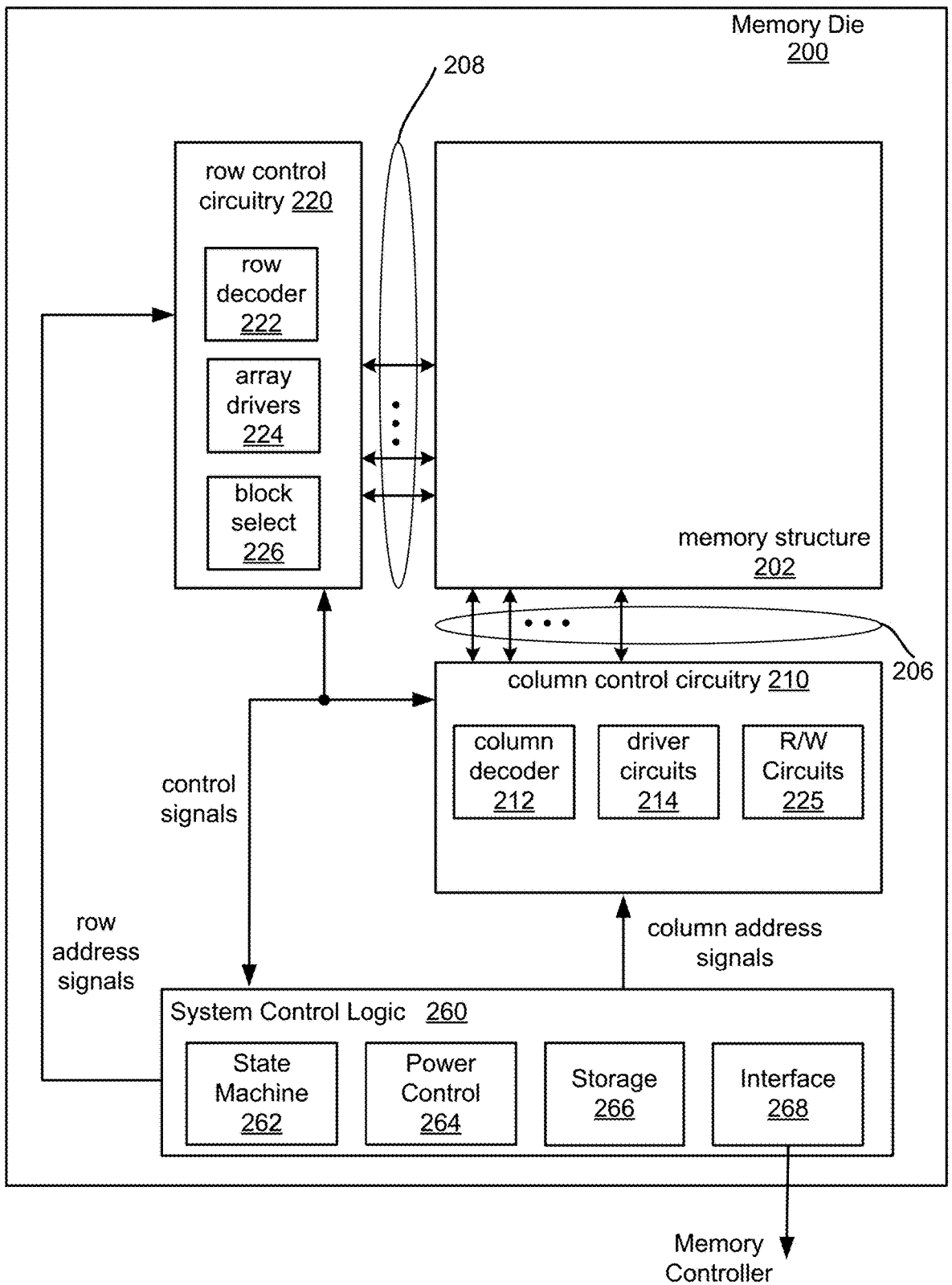
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
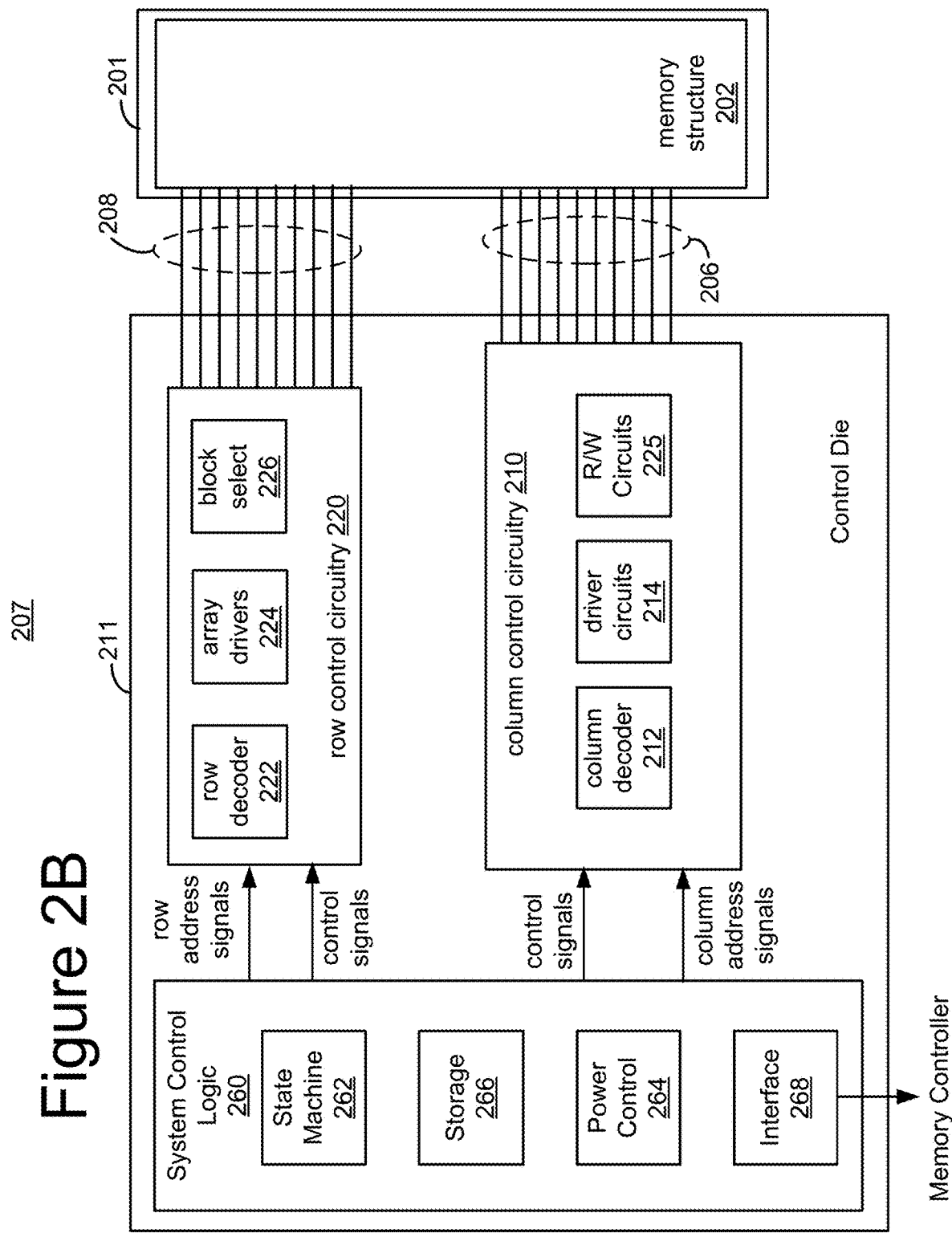
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
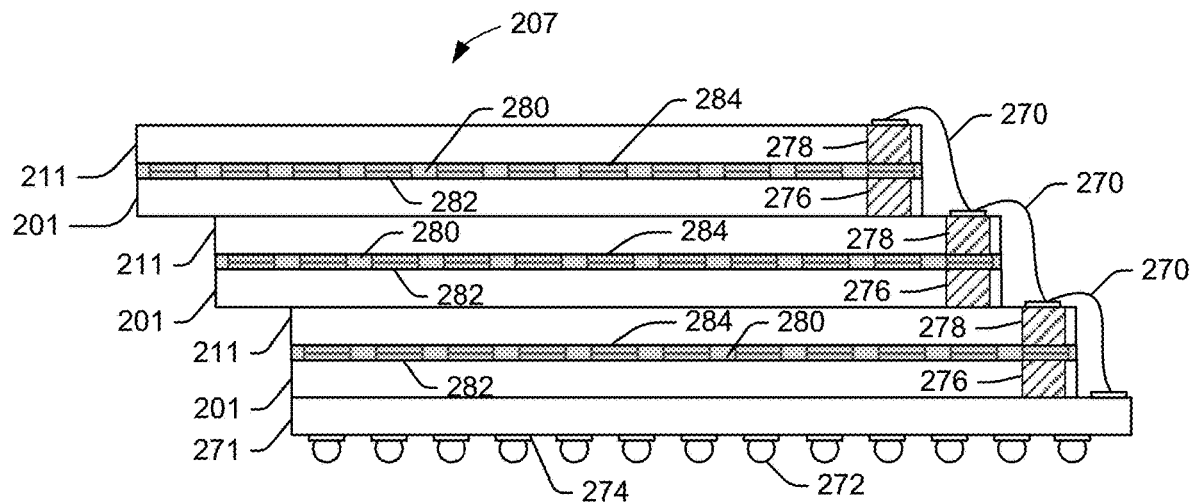
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
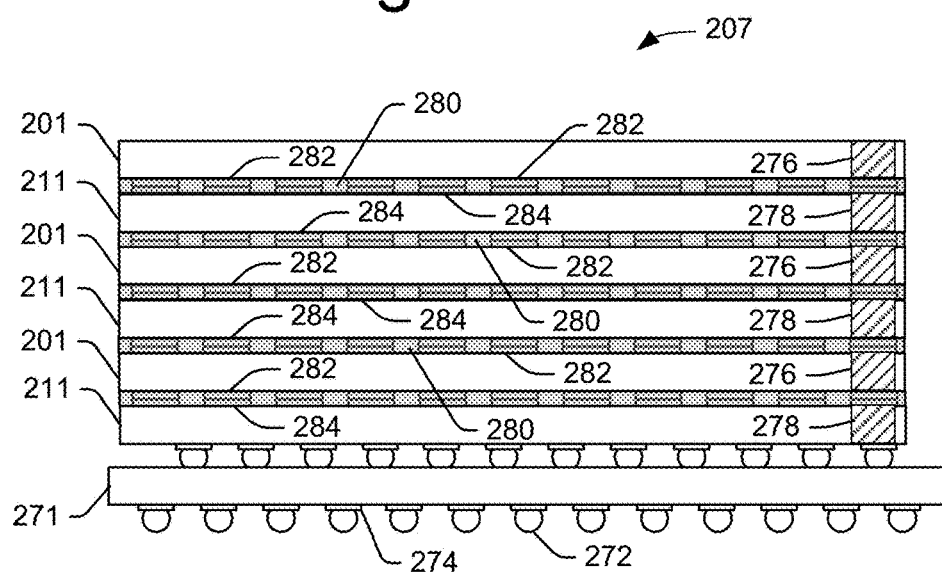

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
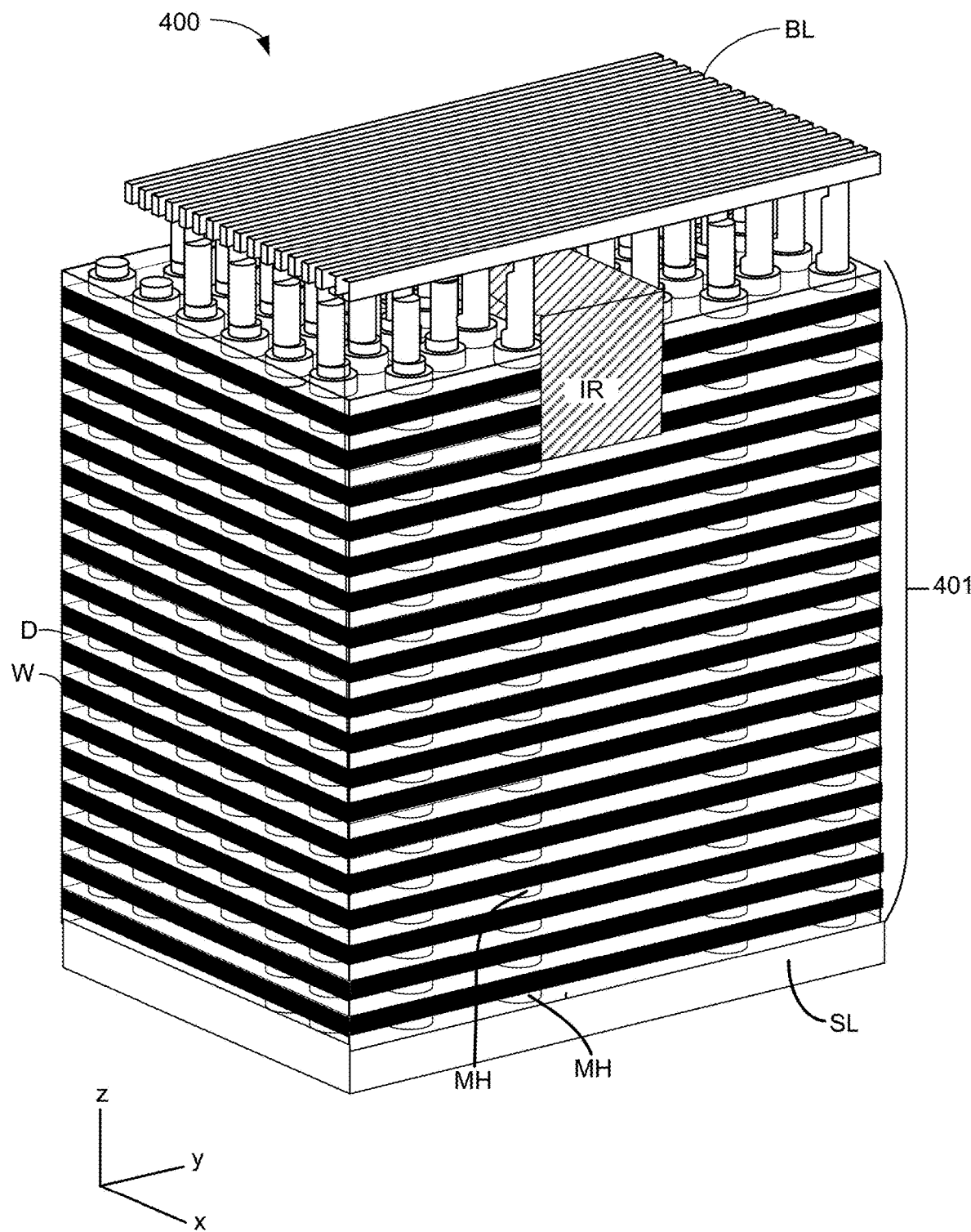
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MHI. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
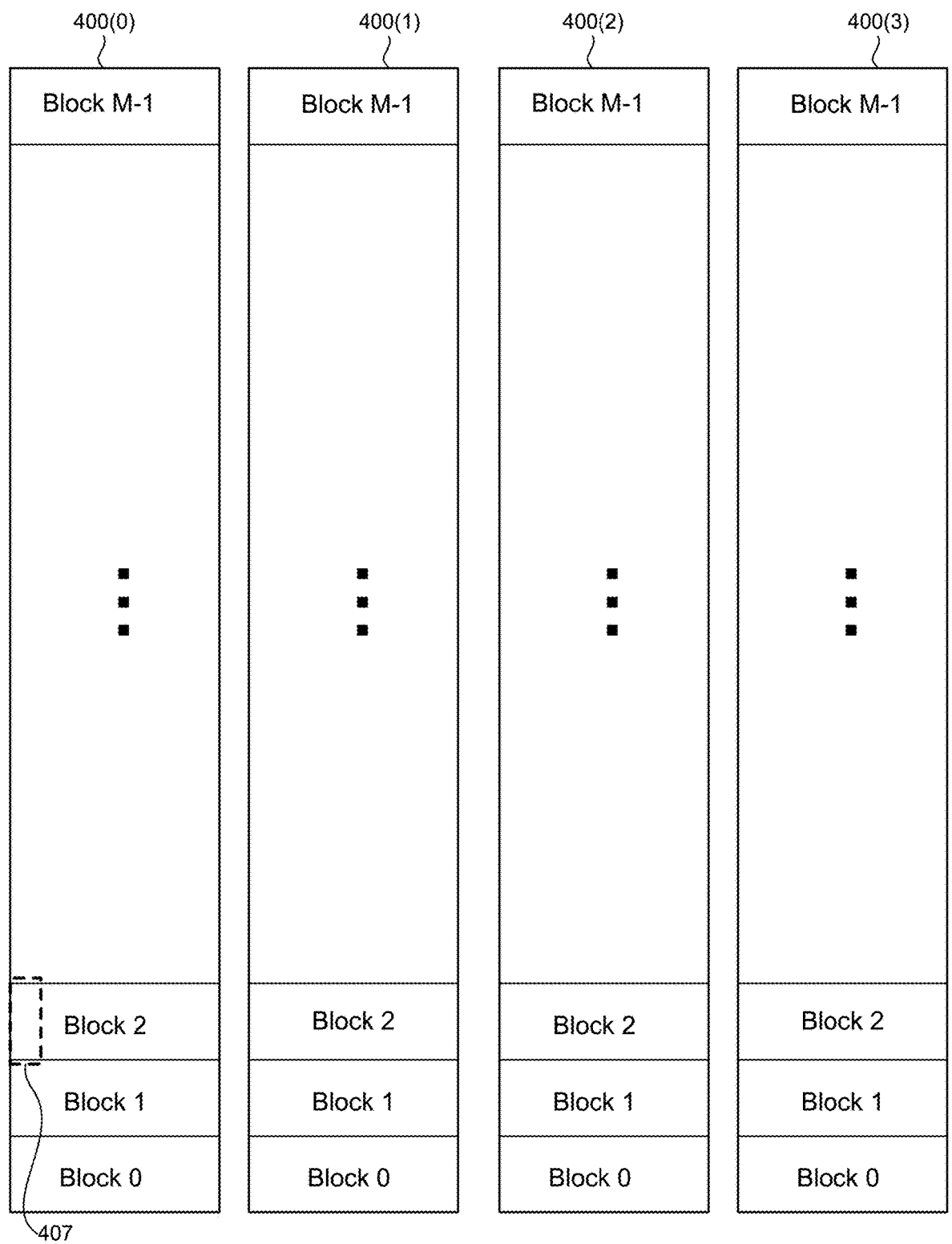
FIG. 4A is a block diagram of one embodiment of a memory structure having four planes.

FIG. 4A is a block diagram explaining one example organization of memory structure 202, which is divided into four planes 400(0), 400(1), 400(2), 400(3). Each plane is then divided into M blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a groups of connected memory cells as the memory cells of a physical block share a common set of word lines. For example, the word lines for a physical block are all connected to all of the vertical NAND strings for that physical block. Although FIG. 4A shows four planes 400(0)-400(3), more or fewer than four planes can be implemented. In some embodiments, memory structure 202 includes eight planes. In some embodiments, erase can be performed in parallel the four planes 400(0)-400(3).

Figure 4B:
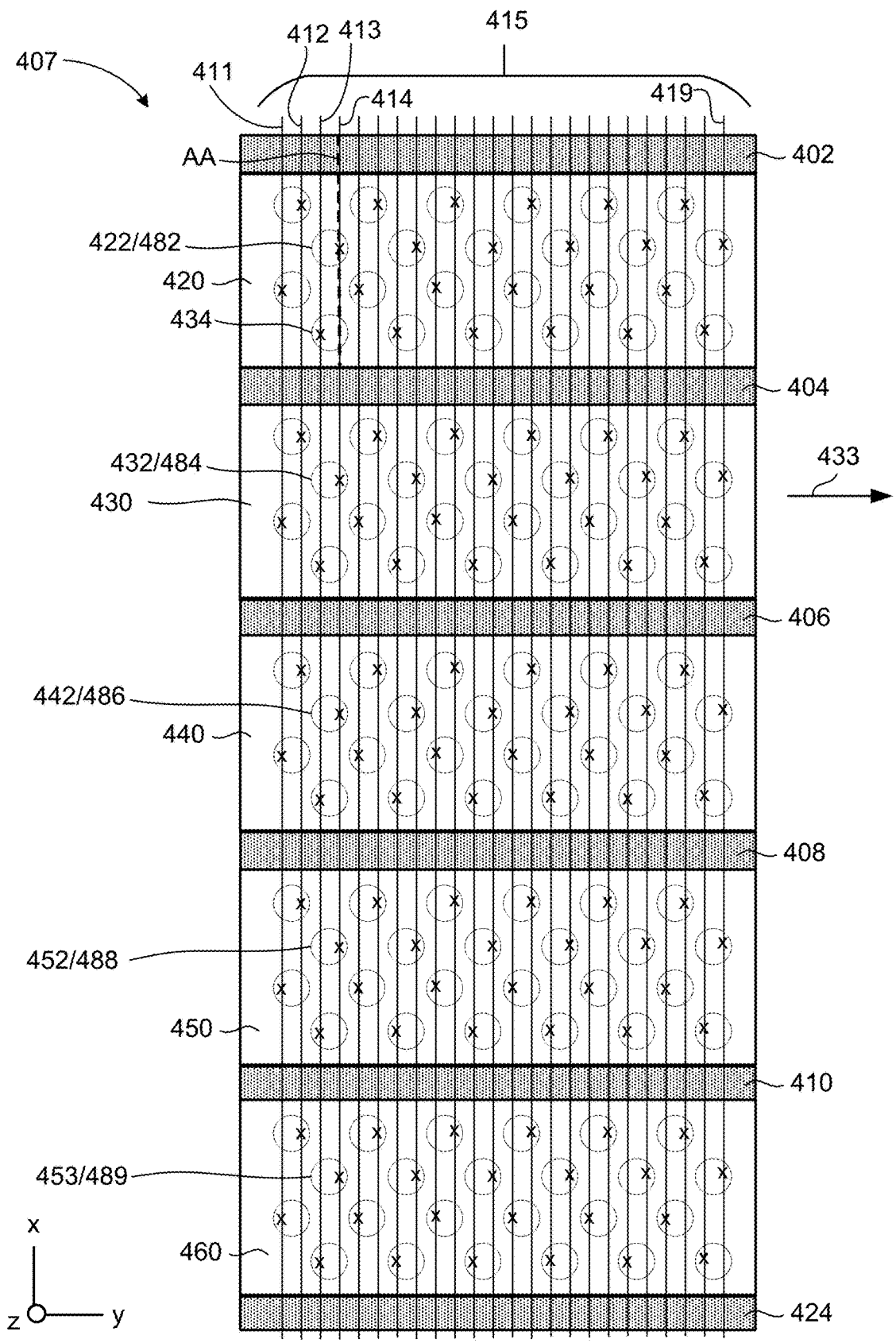
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2 in plane 400(0). As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452, and 453. Vertical column 422 implements NAND string 482. Vertical column 432 implements NAND string 484. Vertical column 442 implements NAND string 486. Vertical column 452 implements NAND string 488. Vertical column 453 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408 or 410. In one example implementation, a bit line only connects to one vertical column/NAND string in each of regions (sub-blocks) 420, 430, 440, 450 and 460. In that implementation, each block has twenty rows of active columns and each bit line connects to five vertical columns/NAND strings in each block. In one embodiment, all of the five vertical columns/ NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
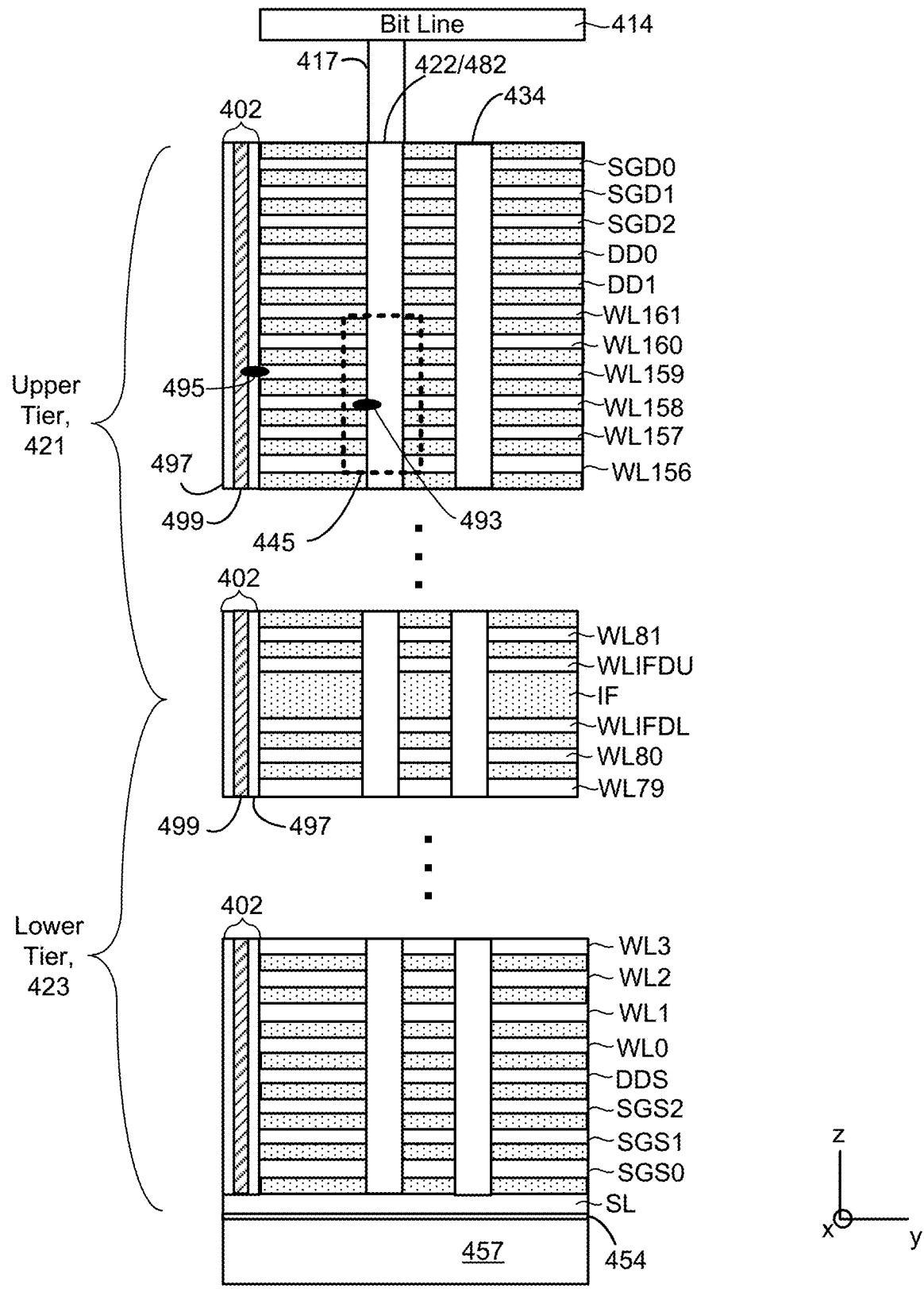
FIG. 4C depicts an embodiment of a stack showing a cross-sectional view along line AA of FIG. 4B.

FIG. 4C depicts a portion of one embodiment of a three dimensional memory structure 202 showing a cross-sectional view along line AA of FIG. 4B. This cross sectional view cuts through vertical columns (NAND strings) 422 and 434 of region 420 (see FIG. 4B). The structure of FIG. 4C includes three drain side select gate layers (SGD0, SGD1 and SGD2). The structure of FIG. 4C also includes three source side select gate layers (SGS0, SGS1 and SGS2). The structure of FIG. 4C also includes five dummy word line layers DD0, DD1, WLIFDU, WLIDDL, DDS; one hundred sixty two word line layers WL0-WL161 for connecting to data memory cells. Dielectric layers are depicted between the conductive layers just described. Other embodiments can implement more or fewer than the numbers described above for FIG. 4C. In one embodiment, SGD0, SGD1 and SGD2 are electrically connected together; and SGS0, SGS1 and SGS2 are electrically connected together.

FIG. 4C depicts an embodiment of a stack having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Vertical columns 432 and 434 are depicted protruding through the drain side select layers, source side select layers, IF layer, dummy word line layers and word line layers. In one embodiment, each vertical column comprises a vertical NAND string. Below the vertical columns and the layers listed below is substrate 457, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 417.

One of the isolation regions 402 is depicted adjacent to the stack, in agreement with FIG. 4B. The isolation region 402 has a conductive region 499 surrounded by an insulating material 497. The conductive region 499 extends down to the source line (SL) and provides operating voltages to the SL. In one embodiment, an erase voltage is provided by way of conductive region 499 to the SL. The conductive region 499 may be formed from, for example, tungsten. The insulating material 497 may be formed from, for example, silicon oxide. It is possible for a short circuit to occur between a word line and the conductive region 499.

An example defect 495 that results in a short circuit between WL159 and the conductive region 499 is depicted. The conductive region 499 may be referred to herein as a local interconnect (LI). Defects such as defect 495 may be present when the memory structure is manufactured or may develop as a result of normal memory operations. Another type of short circuit that may be present is a word line to memory hole short circuit. Defect 493 may result in a short circuit between WL158 and the memory hole 422. Defects such as defect 493 may be present when the memory structure is manufactured or may develop as a result of normal memory operations. Short circuits such as, but not limited to those that result from defects 493, 495 may result in leakage current during memory operations such as read, program and erase. Techniques are disclosed herein for detecting leakage currents that occur during erase operations. As will be discussed in further detail below, leakage currents during erase could result in a severe reduction in the magnitude of the erase voltage, which can impair erase operations. Such leakage current may be especially problematic during when erasing multiple erase blocks in parallel. In one embodiment, leakage current in an erase block is detected early in the erase procedure, with the leaky erase block removed from the multiple erase block erase procedure.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W161 connect to memory cells (also called data memory cells). Dummy word line layers DD0, DD1 and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 4D:
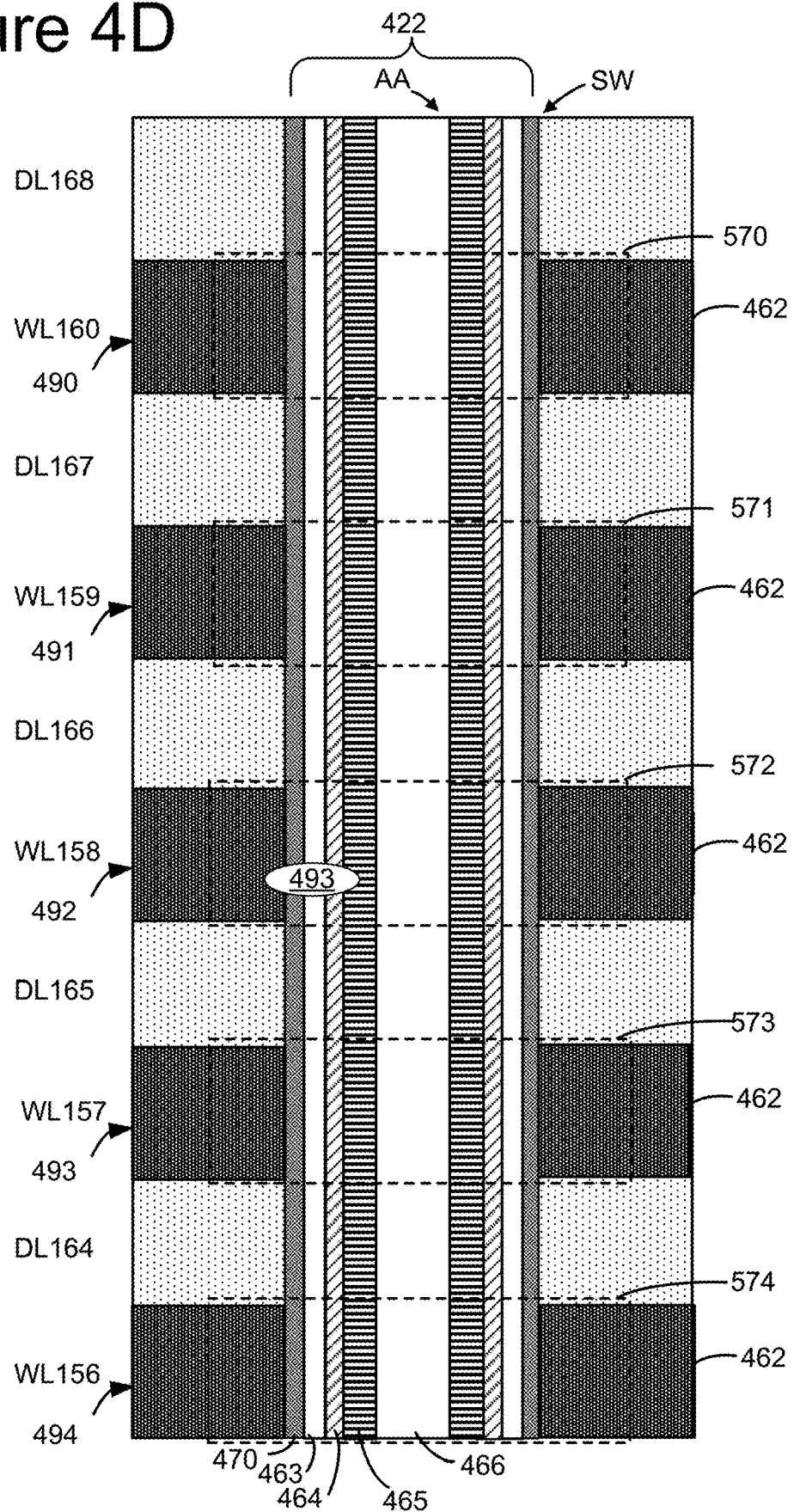
FIG. 4D depicts a view of the region 445 of FIG. 4C.

FIG. 4D depicts a view of the region 445 of FIG. 4C. Included are WL156-160 and dielectric layers DL164-DL168. Data memory cell transistors 570, 571, 572, 573, and 574 are indicated by the dashed lines. A number of layers can be deposited along the sidewall (SW) of the memory hole 422 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

As mentioned above, one type of short circuit that may be detected is a word line to memory hole short circuit. Defect 493 may result in a short circuit between WL158 and one or more of the layers in the memory hole 422 such as, for example, charge-trapping layer 463 and/or polysilicon body 465. In one embodiment, such word line to memory hole short circuits are detected early during an erase procedure of multiple erase blocks.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
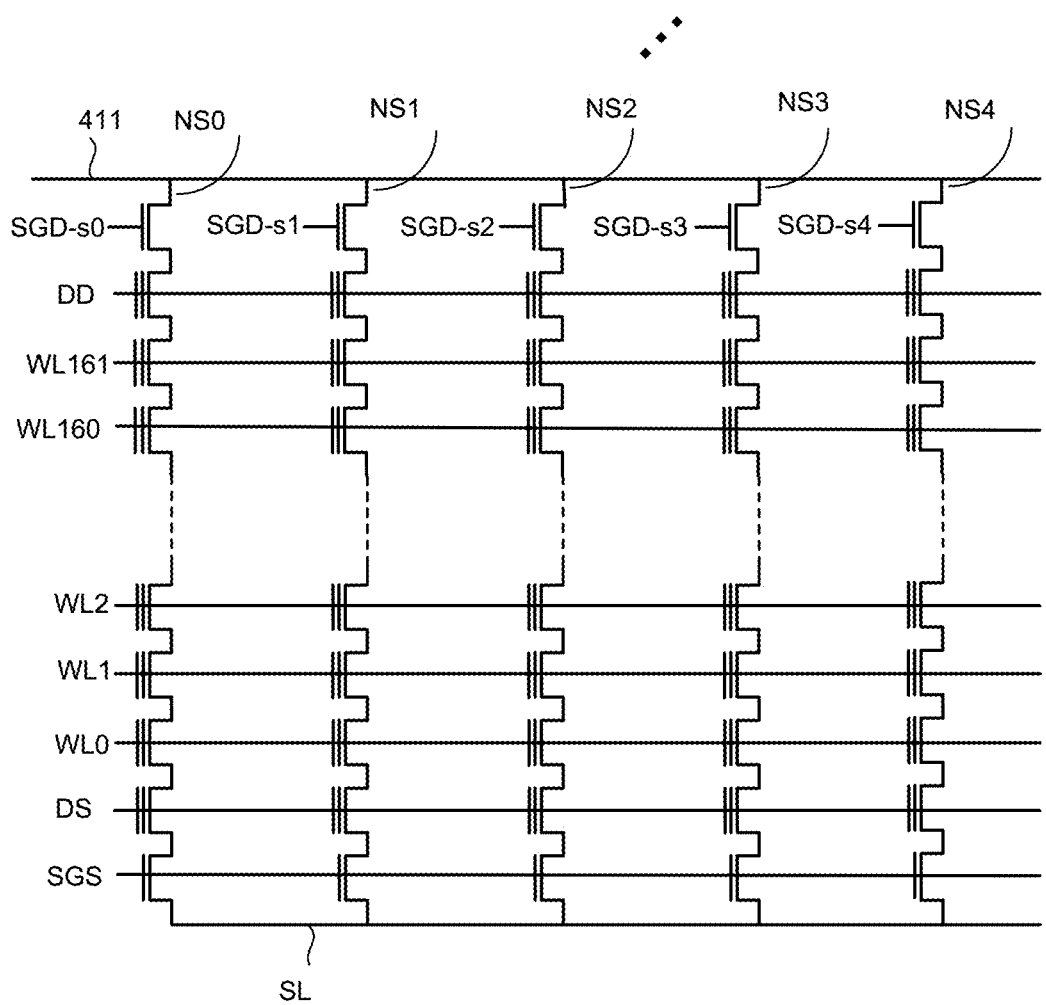
FIG. 4E is a schematic diagram of a portion of one embodiment of a block, depicting several NAND strings.

FIG. 4E is a schematic diagram of a portion of the memory depicted in in FIGS. 4-4D. FIG. 4E shows physical word lines WL0-WL161 running across the entire block. The structure of FIG. 4E corresponds to portion 407 in Block 2 of FIGS. 4A-4B, including bit lines 411, 412, 413, 414, ... 419. Within the block, each bit line is connected to four NAND strings. Drain side selection lines SGD-s0, SGD-s1, SGD-s2, SGD-s3 and SGD-s4 are used to determine which of the five NAND strings (NS0, NS1, NS2, NS3, NS4) connect to the associated bit line. Other NAND strings of the block and other bit lines are not depicted in FIG. 4E. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block.

A source side selection line SGS connects/disconnects the NAND strings to/from the common source line. In some embodiments, there is a source side selection line for each sub-block (similar to the five SGD-s0, SGD-s1, SGD-s2, SGD-s3 and SGD-s4). The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Although the example memories of FIGS. 4-4E are three dimensional memory structure that includes vertical NAND strings with charge-trapping material, other (2D and 3D) memory structures can also be used with the technology described herein.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

Figure 5A:
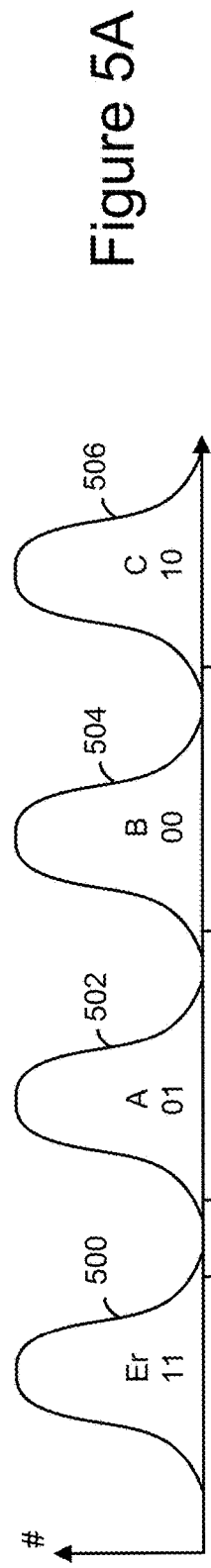
FIGS. 5A, 5B and 5C depict threshold voltage distributions.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 504 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

Figure 5B:
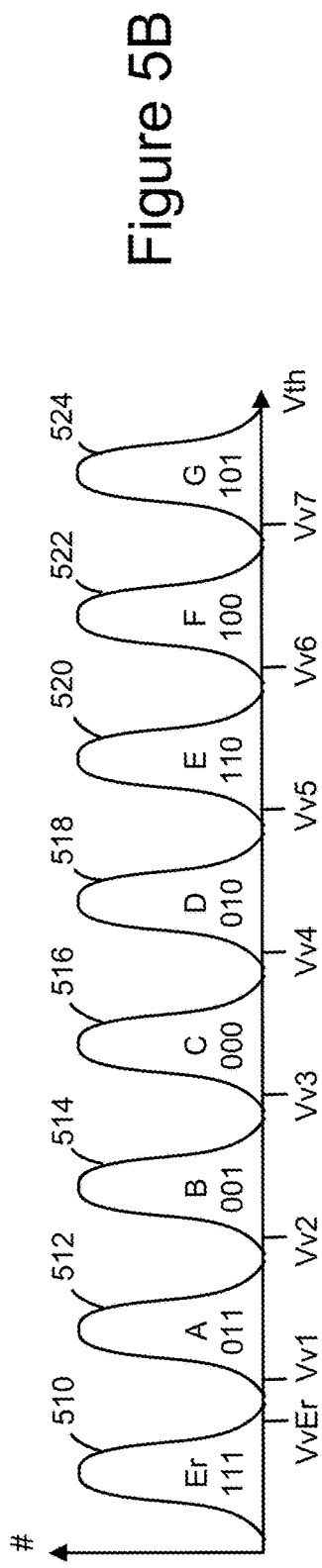

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "A," "B," "C," "D," "E," "F" and "G" memory states are respectively represented by "111," "011," "001," "000," "010," "110," "100" and "101."

Figure 5C:
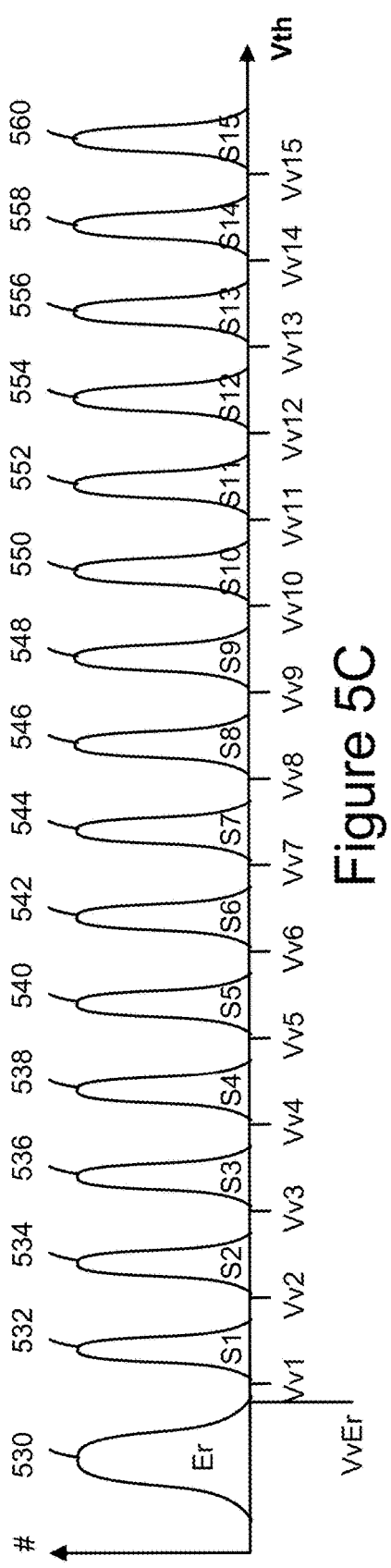

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions 532, 534, 536, 538, 540, 542, 544, 546, 548, 550, 552, 554, 556, 558 and 560 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the sixteen memory states. In an embodiment, the S0, S1, S2, S3, S4, S5, S6, S7, S8, S9, S10, S11, S12, S13, S14 and S15 memory states are respectively represented by "1111," "1110," "1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 120 (FIG. 1) relying on error correction to identify the correct data being stored.

In one embodiment memory cells are erased prior to programming, and erasing is the process of changing the threshold voltage of one or more memory cells from a programmed data state to an erased data state. For example, changing the threshold voltage of one or more memory cells from states A-C to state E of FIG. 5A, from states A-G to state Er of FIG. 5B, or from states S1-S15 to state Er of FIG. 5C.

FIG. 6 is a flowchart describing one embodiment of a process 600 for erasing memory cells. The process 600 may be used to erase an erase block of NAND memory cells. In one embodiment, the process 600 may be used to erase an entire physical block of NAND memory cells. In one embodiment, the process 600 may be used to erase a sub-block of the physical block of NAND memory cells. One type of sub-block are the sub-blocks selected by different select lines such as in FIG. 4E. For example, the sub-block selected by SGD-s0 may be erased independent of the other four sub-blocks. Thus, in the example in FIG. 4E, there may be five sub-blocks selected by the respective SGDs. Another type of sub-block may be referred to as tiers, as depicted in FIG. 4C. In the example in FIG. 4C, upper tier 421 is in one erase block and lower tier 423 is in another erase block. The sub-block concepts in FIGS. 4C and 4E can be combined to form erase blocks. In an embodiment, system control logic 260 performs process 600 in response to a command from the memory controller 120. Process 600 describes a double sided erase in which an erase voltage (Vera) is applied at both ends of NAND strings (e.g., bit lines and source line). A variant is to perform a single sided erase in which the erase voltage is applied to only one end of the NAND strings. The process 600 may be performed in parallel on different erase blocks, which may be in different planes on the same memory die.

Step 602 includes setting an initial magnitude of an erase voltage (Vera). The initial Vera may have a relatively large magnitude such as, for example, 20V. Step 604 includes applying Vera to bit lines associated with the erase block. Step 606 includes applying Vera to one or more source lines associated with the erase block. Step 608 includes applying an erase enable to the word lines in the erase block. In one embodiment, the erase enable voltage is 0V. Step 610 includes applying a select voltage to select lines (e.g., SGD, SGS). The select voltage allows Vera to pass to the NAND channels.

Thus, the erase of a memory cell includes applying an erase enable voltage (e.g., 0V) to the control gate of the memory cell while applying an erase voltage (e.g., about 20V) to a channel or body of the memory cell. An erase voltage is defined herein as a voltage applied to a channel or body of a memory cell that will erase the memory cell providing that the erase enable voltage is also applied to a control gate of that memory cell. A memory cell that has the erase voltage applied to its channel (body) may be inhibited from erase by applying an erase inhibit voltage (e.g., the erase voltage or about 20V) to its control gate. An erase inhibit voltage is defined herein as a voltage that will inhibit erase of a memory cell despite the erase voltage being applied to a channel of that memory cell.

One technique to erase memory cells is to bias a p-well substrate to a high voltage to charge up a NAND channel. An erase enable voltage is applied to control gates of memory cells while the NAND channel is at a high voltage to erase the memory cells. In one embodiment, a p-well erase is performed. In some cases, the NAND strings within a block may share a common well (e.g., a p-well). In a p-well erase, holes may be provided from the p-well in the substrate below the NAND strings. In one embodiment, memory cells may be erased by raising the p-well to an erase voltage (e.g., 20 volts) for a sufficient period of time and grounding the word lines connected to memory cells to be erased. These erase bias conditions may cause electrons to be transferred from the charge-trapping layer or film 463 through the tunneling oxide 464, thereby lowering the threshold voltage of the memory cells within the selected block.

Another approach to erasing memory cells is to generate gate induced drain leakage (GIDL) current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side), in one embodiment. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells.

After steps 604-610 are performed, an erase verify may be performed in step 612. The erase verify may apply for example VvEr (See FIGS. 5A-5C) to each data WLs in the erase block. If all memory cells in the erase block on a given NAND string have a Vt below VvEr then the NAND string will conduct a significant current. Note that if only one tier is being erased then a pass voltage may be applied to word lines in the tier that is not being erased. The pass voltage is a voltage having sufficient magnitude to be above the Vt of the memory cells in the tier not being erased. In some embodiments, if a NAND string passes erase of the NAND string may end at this point. Step 614 is a determination of whether erase is complete. If not the magnitude of the erase voltage may optionally be increased in step 616. Thus, steps 604-614 are repeated. When all NAND strings have passed erase the process ends. In some embodiments, erase may end with a few NAND strings having yet to pass erase.

Process 600 describes a double-sided erase in which Vera is applied to both ends of the NAND strings (bit lines and source line(s)). One embodiment is a single-side erase in which Vera is applied to the bit lines but not to the source line(s). One embodiment is a single-side erase in which Vera is applied to the source line(s) but not to the bit lines.

Figure 7:
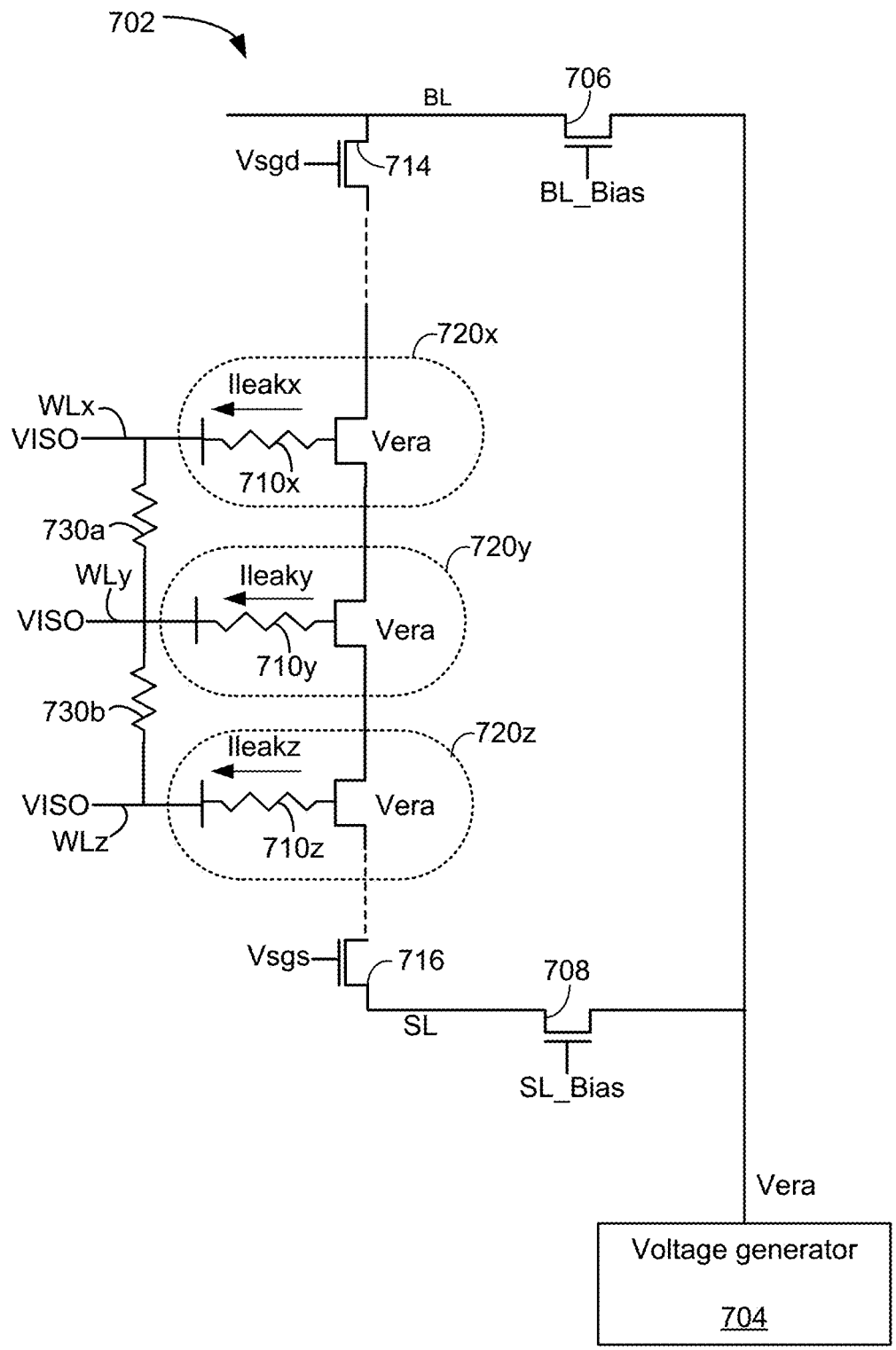
FIG. 7 is a schematic diagram that depicts a NAND string being erased with erase voltages resulting in leakage currents.

An erase block can possibly have one or more defects that result in leakage current during an erase operation. Such leakage current could cause the erase voltage to drop, which could impact erase of other erase blocks during a parallel erase of multiple erase blocks. FIG. 7 is a schematic diagram that depicts a NAND string being erased resulting in leakage currents. The NAND string 702 is connected between a bit line (BL) and source line (SL). A drain side select gate 714 switchably connects the NAND string channel to the BL. A source side select gate 716 switchably connects the NAND string channel to the SL. Only a few of the NAND memory cells 720x, 720y, 720z are depicted. Memory cell 720x has a short circuit represented by resistance 710x between its body (or channel) and its control gate. Memory cell 720y has a short circuit represented by resistance 710y between its body (or channel) and its control gate. Memory cell 720z has a short circuit represented by resistance 710z between its body (or channel) and its control gate. In an embodiment in which the NAND string 702 is formed in a memory hole these may be referred to as control gate to memory hole (MH) shorts (or as WL to MH shorts). There are also two WL to WL shorts depicted. Resistance 730a represents a short between WLx and WLy. Resistance 730b represents a short between WLy and WLz. One of ordinary skill will appreciate that the aforementioned resistances have a sufficiently low resistance such that a significant leakage current may result from application of the voltages during erase.

A voltage generator 704 provides an erase voltage (Vera) to the BL and to the SL. More particularly, BL_bais voltage is applied to the control gate of BL switch transistor 706 to provide Vera from the voltage generator to the BL. Similarly, SL_bais voltage is applied to the control gate of SL switch transistor 708 to provide Vera from the voltage generator 704 to the SL. Select voltage Vsgd is applied to the drain side select transistor 714 to provide Vera from the BL to the NAND channel. Similarly, select voltage Vsgs is applied to the source side select transistor 716 to provide Vera from the SL to the NAND channel. In one embodiment, Vsgd has a suitable magnitude to generate GIDL current (given the magnitude to Vera). In one embodiment, Vsgs has a suitable magnitude to generate GIDL current (given the magnitude to Vera). However, a GIDL current based erase is not required. The voltage VISO that is applied to WLx, WLy and WLz is an erase enable voltage (e.g., 0V). The voltage generator 704 may be part of power control 264 (see FIG. 2A or 2B).

The first leakage current Ileakx that is depicted in memory cell 720x results from the difference in potential across resistance 710x (due to Vera in the channel of cell 720 minus VISO on the control gate). Similar leakage currents Ileaky and Ileakxz may occur across cells 720y and 720z, respectively. Note that these various leakage currents may add with each other, thereby presenting a significant issue. It is possible for Vera to drop, which could thereby impair the erase operation. The voltage generator 704 may have a voltage ramping phase and a maintain phase. During the voltage ramping phase the erase voltage is ramped up to the target erase voltage. During the maintain phase the erase voltage is held at the target erase voltage. The voltage generator 704 may have an assist circuit that is active during the ramping phase to help speed the rampup. However, the assist circuit may be inactive during the maintain phase, which can make Vera more susceptible to dropping in the event there are significant leakage currents.

Figure 8:
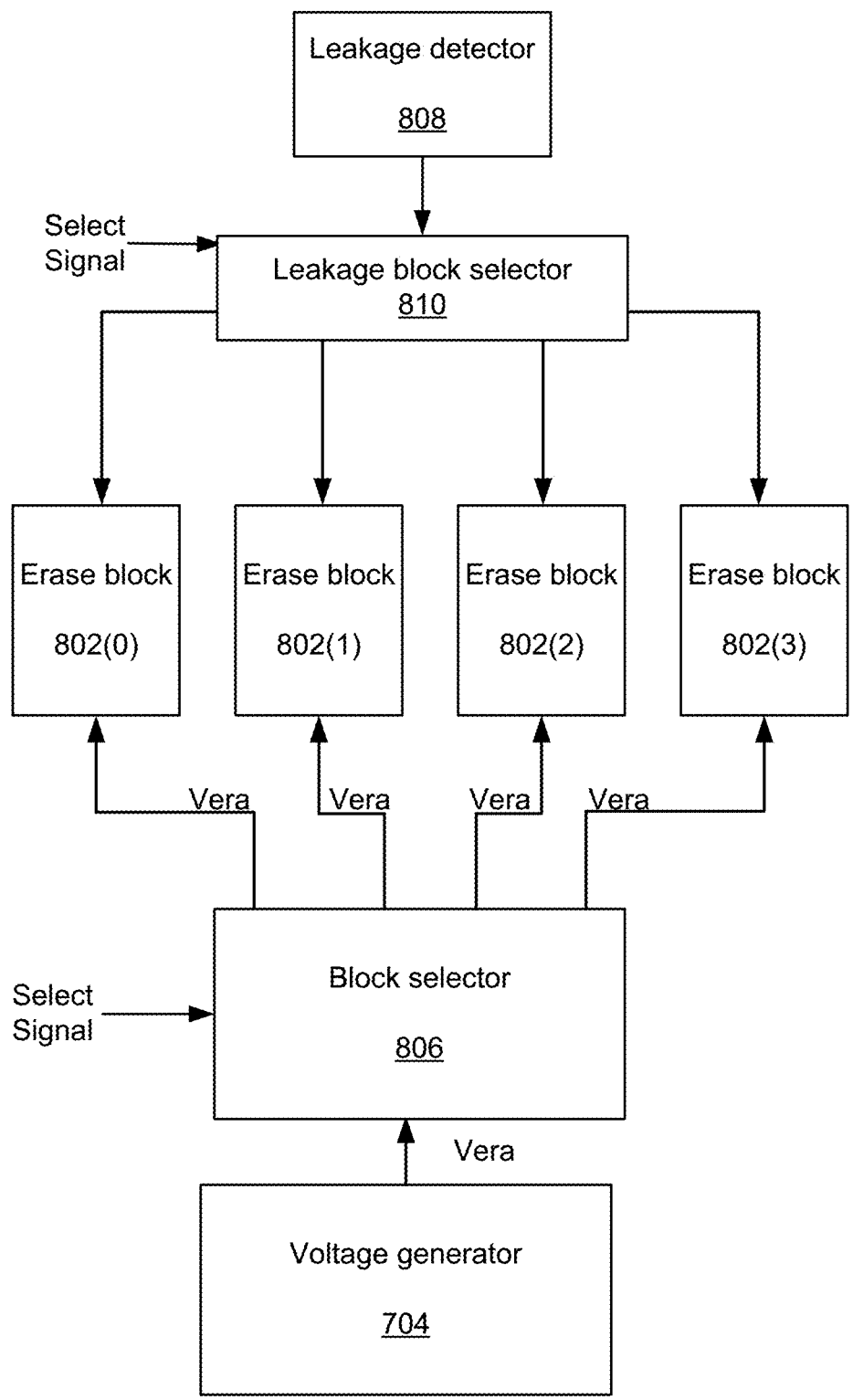
FIG. 8 is a block diagram of one embodiment of an erase system within a storage system.

FIG. 8 is a block diagram of one embodiment of an erase system within a storage system 100. The system may erase multiple erase blocks 802(0), 802(1), 802(2), 802(3) in parallel. In an embodiment, each erase block is in a different plane of a memory die. The memory die may have one or more 3D NAND structures as described herein. In this example, there are four erase blocks that can be erased in parallel, but the system may erase more or fewer than four erase blocks in parallel. The voltage generator 704 is configured to generate an erase voltage (Vera) which could have a magnitude of about 20V, for example. The block selector 806 selects which erase block 802 will receive Vera. The block selector 806 may provide Vera to all of the erase blocks 802 at the same time. The block selector 806 may provide Vera to one erase block at a given time. The leakage detector 808 is configured to detect a leakage current while Vera be being applied. In an embodiment, the leakage block selector 810 is configured to select which erase block 802 is to be tested for the leakage current. In one embodiment, the leakage detector 808 checks for a leakage current in a selected erase block while Vera is applied to just that selected erase block 800. The leakage detector 808 will test each of the erase blocks in sequence. Thus, the leakage detector 808 is able to determine which of the erase blocks 802(0), 802(1), 802(2), 802(3), if any, has a leakage current. The leakage detector 808 may be part of power control 264 (see FIG. 2A or 2B).

In an embodiment, the leakage testing is performed during the first loop of an erase procedure that erases the erase blocks 802(0)-802(3) in parallel. If an erase block 802 has a leakage current, then that erase block is removed early from the erase procedure. Therefore, the erase block 802 with leakage will not disturb the erase procedure in the other erase blocks.

Figure 9:
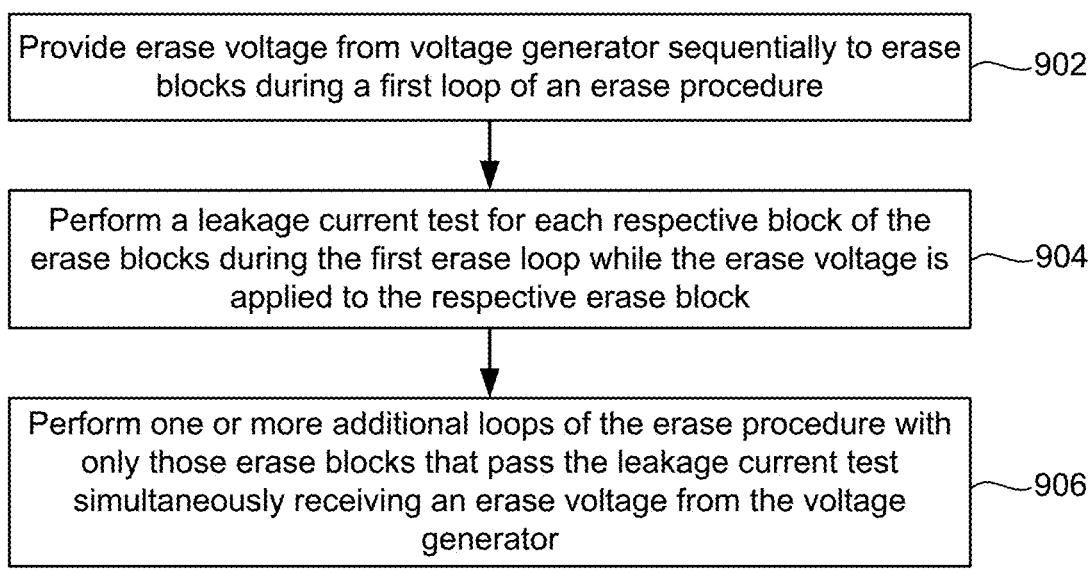
FIG. 9 is a flowchart of one embodiment of a process of parallel erase of multiple erase blocks with early termination of erase in an erase block having leakage current.

FIG. 9 is a flowchart of one embodiment of a process 900 of parallel erase of multiple erase blocks with early termination of erase in an erase block having significant leakage current. In an embodiment, system control logic 260 performs process 900 in response to a command from the memory controller 120 to erase a set of erase blocks. Step 902 includes providing an erase voltage (e.g., Vera) from the voltage generator 704 sequentially to erase blocks 800 during a first loop of an erase procedure. In an embodiment, the erase voltage is provided to NAND channels in the respective erase blocks. In an embodiment, the erase voltage is provided to the NAND channels by way of bit lines. In an embodiment, the erase voltage is provided to the NAND channels by way of source lines. In an embodiment, the erase voltage is provided to the NAND channels by way of both bit lines and source lines.

Step 904 includes performing a leakage current test for each respective erase block 800 of the erase blocks during the first erase loop while the erase voltage is applied to the respective erase block. In an embodiment, the leakage current test for a respective erase block includes measuring a magnitude of the erase voltage after applying the erase voltage to the respective erase block. In one embodiment, each erase block is tested in sequence without the voltage generator 704 lowering the erase voltage to a steady state voltage (e.g., 0V or Vss).

Step 906 includes performing one or more additional loops of the erase procedure with only those erase blocks that pass the leakage current test simultaneously receiving an erase voltage from the voltage generator 704. Thus, if any erase block fails the leakage current test it is removed from the erase procedure early in the erase procedure.

Figure 11A:
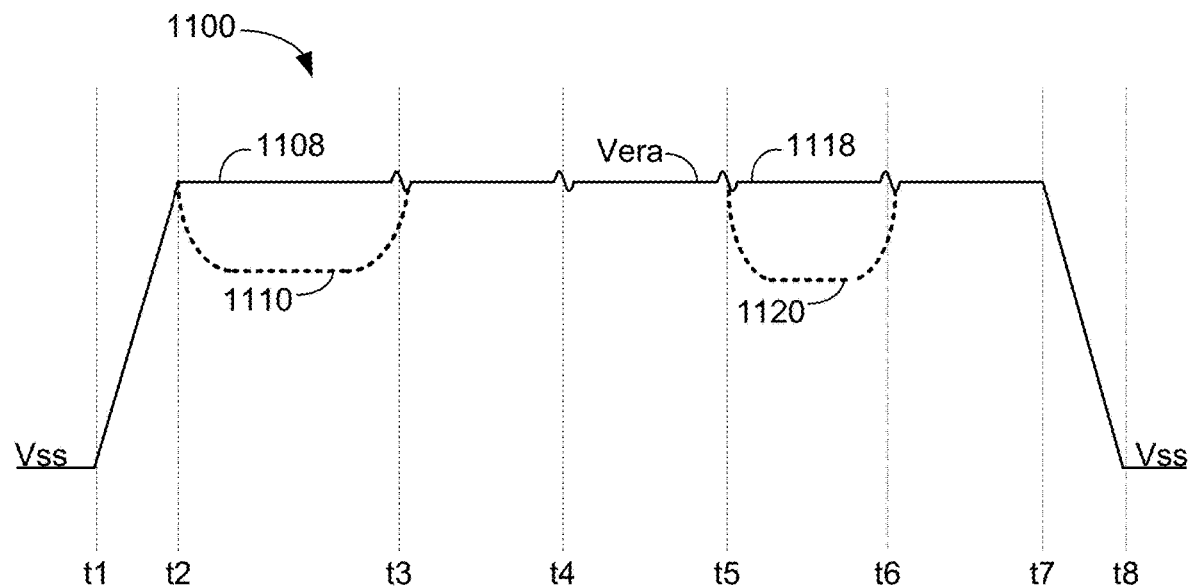
FIGS. 11A and 11B depict erase voltages that are generated by the voltage generator in one embodiment of erase.
Figure 11B:
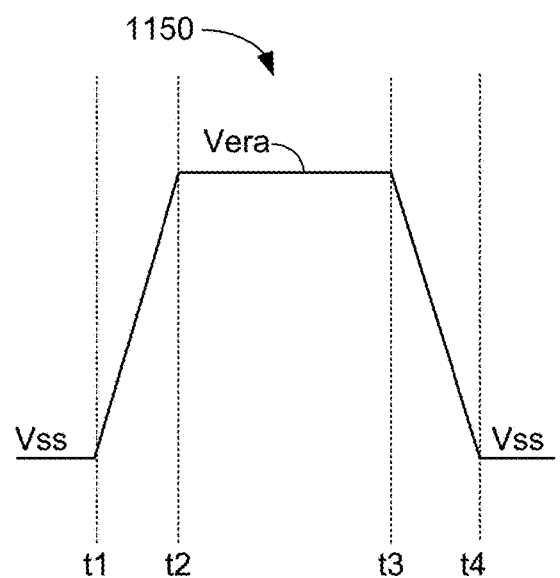

FIG. 10 is a flowchart of one embodiment of a process 1000 of parallel erase of multiple erase blocks with early termination of erase in an erase block having significant leakage current. In an embodiment, system control logic 260 performs process 1000 in response to a command from the memory controller 120 to erase a set of erase blocks. Process 1000 provides further details for one embodiment of process 900. FIGS. 11A and 11B depict erase voltages that are generated by the voltage generator 704 in one embodiment of process 1000. Those voltages will be discussed the description of process 1000. Step 1002 includes generating an erase voltage (e.g., Vera) with a voltage generator 704.

Step 1004 includes providing the erase voltage to erase blocks 800 in multiple planes. In one embodiment, the erase voltage is provided to bit lines associated with the erase blocks. In one embodiment, the erase voltage is provided to source lines associated with the selected erase blocks. In one embodiment, the erase voltage is provided to both bit lines and source lines associated with the erase blocks. Step 1004 may also include applying an erase enable voltage to word lines in the erase blocks. Step 1004 may also include applying select voltages to select lines (e.g., SGD, SGS) in the erase blocks. Thus, step 1004 may erase memory cells in the erase blocks in parallel.

With reference to FIG. 11A at time t1 the voltage generator 704 begins to generate the erase voltage 1100. By t2 the erase voltage has ramped up to its target magnitude. The period between t1 and t2 may be referred to as a ramping period. In one embodiment, the voltage generator 704 uses an assist circuit during the ramping period to facilitate rapid ramping of the erase voltage. In one embodiment, the target magnitude is a nominal erase voltage of about 20V. In another embodiment, the target magnitude is significantly less, such as, for example, 10V. This significantly lower erase voltage may be referred to herein as a dummy pulse. The magnitude of the dummy pulse may be sufficiently low such that the memory cells are not erased. Between t2 and t3 the erase voltage 1100 is applied to all of the erase blocks involved in the erase procedure. If there is no leakage current in any of the erase blocks then the erase voltage magnitude will be at its target value between t2 and t3 as indicated by line 1108. However, if any of the erase blocks has a significant leakage current then the magnitude of the erase voltage 1100 may droop, as indicated by dashed line 1110. This drooping of the erase voltage may impact all erase blocks involved in the erase procedure. Therefore, even those erase blocks without any significant leakage current may have erase impaired. However, at this time the storage system 100 does not know which of the erase blocks, if any, has the leakage current.

Step 1006 includes selecting an erase block to test for leakage current. The process loops through steps 1010-1020 when testing this erase block. Step 1010 includes providing the erase voltage to the erase block that has been selected for leakage detection. The erase voltage is not provided to the erase blocks that are not presently under test. In an embodiment, the erase voltage is provided to NAND channels in the erase blocks under test In one embodiment, the erase voltage is provided to bit lines associated with the erase blocks under test. In one embodiment, the erase voltage is provided to source lines associated with the erase blocks under test. In one embodiment, the erase voltage is provided to both bit lines and source lines associated with the erase blocks under test. Step 1010 may also include applying an erase enable voltage to word lines in the erase blocks under test. Step 1010 may also include applying select voltages to select lines (e.g., SGD, SGS) in the erase blocks under test to provide the erase voltages from the bit lines and or source lines to the NAND channels.

Step 1012 includes testing the selected erase block for leakage current. The test is performed while the erase voltage is applied to the selected erase block but not to the other erase blocks being erased in the erase procedure. In an embodiment, the leakage current test for a respective erase block includes determining whether a drop in a magnitude of the erase voltage after applying the erase pulse from the voltage generator to the erase blocks exceeds a threshold. Further details of various embodiments of the leakage test are shown and described with respect to FIGS. 12A, 12B, and 12C.

With reference to FIG. 11A between t3 and t4 the voltage generator 704 continues to generate the erase voltage 1100. However, between t3 and t7 the erase voltage 1100 is only applied to one of the erase blocks. For example, between t3 and t4 the erase block is only applied to erase block 800(0); between t4 and t5 the erase block is only applied to erase block 800(1); between t5 and t6 the erase block is only applied to erase block 800(2); and between t6 and t7 the erase block is only applied to erase block 800(3). Between t2 and t7 the voltage generator 704 may operate in a maintain phase in which the voltage generator 704 attempts to maintain the erase voltage at the target erase voltage. Thus, in an embodiment, between t2 and t7 the voltage generator 704 does not bring the erase voltage back down to a steady state magnitude. During an embodiment of the maintain phase the voltage generator 704 does not use the aforementioned assist circuit, which may make it more difficult to maintain the erase voltage at the target magnitude in the event of significant leakage currents an erase block.

There may be a slight ripple in the erase voltage 1100 in the transitions at around t3, t4, t5, and t6. If any of the erase blocks has a significant leakage current then the magnitude of the erase voltage 1100 may droop, as indicated by dashed line 1120 between t5 and t6. This drooping of the erase voltage indicates, in this example, that there is significant leakage current in erase block 800(2). If erase block 800(2) does not have significant leakage current then the erase voltage will remain at the target level as indicated by line 1118.

Step 1014 is a determination of whether the leakage test passed or failed. If the erase block failed the leakage test then in step 1016 this erase block is removed from the erase procedure. Therefore, this erase block will not receive any further erase voltages. Step 1018 includes reporting this erase block as a bad erase block. In an embodiment the system control logic 260 reports to the memory controller 120. This report is not required to be completed until after the erase procedure is complete, but can be performed during the erase procedure. In one embodiment, the system control logic 260 updates a status register. This status register could be updated after all the erase blocks are tested for leakage current. As one example, each erase block may be assigned one bit in the status register. The pass/fail status for each respective erase block may thus be reported in the status register. In one embodiment, the memory controller 120 may issue a status command to the memory die, which reports the contents of the status register to the memory controller 120.

Step 1020 includes a determination of whether there is another erase block to test. If so, steps 1006-1020 are repeated for the next erase block (steps 1016 and 1018 being performed only if the leakage test result is "fail"). After all erase blocks involved in the erase procedure are tested for leakage current the process continues at step 1022. Step 1022 includes an erase verify after the erase voltage has been brought down to Vss (see t7 to t8 in FIG. 11A). Step 1024 includes a test of whether erase is complete. If so, the process concludes. In one embodiment, the erase verify is skipped after the first erase loop (e.g., not performed after step 1020).

If the erase procedure is not yet complete, another erase voltage is generated in step 1026. This erase voltage is applied simultaneously to only the erase blocks that passed the leakage current test in step 1028. FIG. 11B depicts an example erase voltage 1150 that may be generated by the voltage generator 704 and applied to simultaneously to only the erase blocks that passed the leakage current test. Between t1 and t2 the erase voltage ramps up from Vss to the target voltage (Vera). Between t2 and t3 the erase voltage is maintained at the target voltage in order to erase memory cells. Between t3 and t4 the erase voltage 1150 is brought down from the target voltage to Vss.

In one embodiment, the time duration of the erase voltage applied to all erase blocks together during the first loop is about the same as the time duration of the erase voltage applied to all erase blocks together (that passed the leakage test) during the one or more additional erase loops. For example, the time between t2 and t3 in FIG. 11A may be about the same as the time between t2 and t3 in FIG. 11B. However, in another embodiment, the time duration of the erase voltage applied to all erase blocks together during the first loop is significantly shorter the time duration of the erase voltage applied to all erase blocks together (that passed the leakage test) during the one or more additional erase loops. For example, tin one embodiment, the time between t2 and t3 in FIG. 11A is significantly shorter than the time between t2 and t3 in FIG. 11B. The significantly shorter erase pulse in the first erase loop can help to prevent over-erasure of memory cells during the first erase loop.

FIGS. 12A, 12B, and 12C depict flowcharts of various embodiments of testing a selected erase block for leakage current. FIG. 12A is a flowchart of one embodiment of a process 1200 in which the erase voltage is provided to NAND channels by way of bit lines, but not by source lines. Step 1202 includes providing the erase voltage (e.g., Vera) to bit lines of the selected erase block. Step 1204 includes providing an erase enable voltage to word lines in the selected erase block. In the event that the upper tier only is being erased then the erase enable voltage is provided to word lines in the upper tier but not the lower tier. Step 1206 includes providing Vgidl to the SGD in the selected erase block. Vgidl is a voltage that, in combination with Vera on the bit lines, will generate GIDL current. Step 1206 will result in the erase voltage being transferred to the NAND channels in the selected erase block. Step 1208 includes measuring the erase voltage (Vera) on the bit lines. Step 1210 is a determination of whether the magnitude of the erase voltage is less than a threshold. If Vera is less than the threshold then the leakage test status is set to fail in step 1212. If Vera is not less than the threshold then the leakage test status is set to pass in step 1214. In one embodiment, the magnitude of the erase voltage is measured with a determination that there is a leakage current of the magnitude falls below a pre-determined voltage. In an embodiment, process 1200 may detect a leakage current associated with a WL-MH short (see defect 493 in FIG. 4C).

FIG. 12B is a flowchart of one embodiment of a process 1220 in which the erase voltage is provided to NAND channels by way of one or more source lines, but not by bit lines. Step 1222 includes providing the erase voltage (e.g., Vera) to one or more source lines of the selected erase block. In one embodiment, the erase voltage is applied to an LI (see 402 in FIG. 4C), which is connected to the source line. Step 1224 includes providing an erase enable voltage to word lines in the selected erase block. In the event that the lower tier 423 only is being erased then the erase enable voltage is provided to word lines in the lower tier 423 but not the upper tier 421. Step 1226 includes providing Vgidl to the SGS in the selected erase block. Vgidl is a voltage that, in combination with Vera on the source lines, will generate GIDL current. In another embodiment, holes for the erase are provided by a p-well in substrate 457 in which case the GIDL current is not needed to provide holes for the erase. Step 1226 will result in the erase voltage being transferred to the NAND channels in the selected erase block. Step 1228 includes measuring the erase voltage (Vera) on the source lines. Step 1230 is a determination of whether the magnitude of the erase voltage is less than a threshold. If Vera is less than the threshold then the leakage test status is set to fail in step 1232. If Vera is not less than the threshold then the leakage test status is set to pass in step 1234. In an embodiment, process 1220 may detect a leakage current associated with either a WL-LI short (see defect 495 in FIG. 4C) or a leakage current associated with a WL-MH short (see defect 493 in FIG. 4C).

FIG. 12C is a flowchart of one embodiment of a process 1240 in which the erase voltage is provided to NAND channels by way of one or more source lines and by bit lines. Step 1242 includes providing the erase voltage (e.g., Vera) to one or more source lines of the selected erase block. Step 1244 includes providing the erase voltage (e.g., Vera) to bit lines of the selected erase block. Step 1246 includes providing an erase enable voltage to word lines in the selected erase block. Step 1248 includes providing Vgidl to the SGS in the selected erase block. Step 1250 includes providing Vgidl to the SGS in the selected erase block. Steps 1248 and 1250 will result in the erase voltage being transferred to the NAND channels in the selected erase block. Step 1252 includes measuring the erase voltage (Vera). Step 1254 is a determination of whether the magnitude of the erase voltage is less than a threshold. If Vera is less than the threshold then the leakage test status is set to fail in step 1256. If Vera is not less than the threshold then the leakage test status is set to pass in step 1258. In an embodiment, process 1240 may detect a leakage current associated with either a WL-LI short (see defect 495 in FIG. 4C) or a leakage current associated with a WL-MH short (see defect 493 in FIG. 4C).

In view of the foregoing, a first embodiment includes an apparatus comprising a voltage generator configured to generate an erase voltage. The apparatus comprises one or more control circuits in communication with the voltage generator. The one or more control circuits are configured to connect to non-volatile memory cells arranged as NAND strings. The non-volatile memory cells are arranged in erase blocks. The one or more control circuits are configured to apply a first erase voltage from the voltage generator sequentially to a plurality of the erase blocks during a first loop of an erase procedure of the plurality of the erase blocks. The one or more control circuits are configured to perform a leakage current test sequentially for each respective block of the erase blocks during the first loop while the first erase voltage is applied to the respective erase block under test. The one or more control circuits are configured to perform one or more additional loops of the erase procedure with only those erase blocks that pass the leakage current test simultaneously receiving a corresponding one or more additional erase voltages from the voltage generator.

In a second embodiment, in furtherance to the first embodiment, the leakage test comprises the one or more control circuits: applying the first erase voltage to channels of the memory cells in a selected erase block of the plurality of the erase blocks; and determining whether a magnitude of the first erase voltage after applying the first erase voltage to the channels is below a threshold.

In a third embodiment, in furtherance to the second embodiment, the one or more control circuits are further configured to apply an erase enable voltage to control gates of the memory cells of the selected erase block while the first erase voltage is applied to the channels of the memory cells of the selected erase block.

In a fourth embodiment, in furtherance to any of the second to third embodiments, applying the first erase voltage to the channels of the memory cells in the selected erase block comprises the one or more control circuits: applying the first erase voltage to bit lines associated with the NAND strings of the selected erase block; and applying a select voltage to select transistors on the NAND strings to connect the NAND channels to the bit lines.

In a fifth embodiment, in furtherance the any of the second to fourth embodiments, applying the first erase voltage to the channels of the memory cells in the selected erase block comprises the one or more control circuits: applying the first erase voltage to one or more source lines associated with the NAND strings of the selected erase block; and applying a select voltage to select transistors on the NAND strings to connect the NAND channels to the one or more source lines.

In a sixth embodiment, in furtherance the fifth embodiment, the one or more control circuits are further configured to apply the first erase voltage to the one or more source lines through a local interconnect that is adjacent to word lines in the selected erase block that connect to the memory cells in the selected erase block.

In a seventh embodiment, in furtherance any of the first to sixth embodiments, the one or more control circuits are further configured to apply the first erase voltage from the voltage generator simultaneously to the plurality of the erase blocks during the first loop of the erase procedure. The leakage current test is performed after the first erase voltage is applied simultaneously to the plurality of the erase blocks and without lowering the first erase voltage to a steady state voltage.

In an eighth embodiment, in furtherance to the seventh embodiment, the first erase voltage is a dummy erase voltage that has a lower magnitude than the one or more additional erase voltages applied during the corresponding one or more additional loops and does not erase the memory cells.

In a ninth embodiment, in furtherance to the seventh embodiment, the first erase voltage is a dummy erase voltage that has a shorter duration than a duration of one or more additional erase voltages applied during the corresponding one or more additional loops.

In a tenth embodiment, in furtherance to any of the first to ninth embodiments, the one or more control circuits do not perform an erase verify in the first loop. The one or more control circuits perform an erase verify for each of the one or more additional loops.

One embodiment includes a method for erasing NAND memory cells. The method comprises generating a first erase voltage with a voltage generator. The method comprises providing the first erase voltage simultaneously to channels of NAND memory cells in an erase block in each of a plurality of planes during a first loop of an erase procedure of the erase block in each plane. The method comprises providing the first erase voltage sequentially to the channels of NAND memory cells in the erase block in each of the planes without bringing the first erase voltage down to a steady state voltage. The method comprises testing for leakage current in each respective erase block while the first erase voltage is applied to the channels of the memory cells in the respective erase block during the first loop of the erase procedure. The method comprises generating one or more additional erase voltages with the voltage generator after bringing the first erase voltage down to the steady state voltage. The method comprises applying the one or more additional erase voltages during a corresponding one or more additional loops of the erase procedure simultaneously to only the channels of memory cells of those erase blocks that pass the leakage current test.

One embodiment includes a non-volatile storage system comprising a memory die comprising a plurality of planes. Each plane has blocks. Each block has NAND strings having memory cells, word lines connected to the memory cells of the NAND strings, and one or more source lines associated with second ends of the NAND strings. Each plane has bit lines associated with first ends of the NAND strings. The non-volatile storage system has a voltage generator configured to generate an erase voltage. The non-volatile storage system has means for providing a first erase voltage from the voltage generator sequentially to NAND channels in a block in each of the planes during a first loop of an erase procedure of a group of memory cells in each of the plurality of the blocks. The non-volatile storage system has means for testing sequentially the block in each of the planes for leakage current while only NAND channels in a selected block receive the first erase voltage during the first loop of the erase procedure. The non-volatile storage system has means for providing one or more additional erase voltages from the voltage generator simultaneously to NAND channels in only those blocks that pass the leakage current test during a corresponding one or more additional loops of the erase procedure.

In an embodiment, the means for providing a first erase voltage from the voltage generator sequentially to NAND channels in a block in each of the planes during a first loop of an erase procedure of a group of memory cells in each of the plurality of the blocks comprises one or more of memory controller 120, system control logic 260, state machine 262, power control 264, column control circuitry 210, row control circuitry 220, voltage generator 704, a processor, an FPGA, an ASIC, and/or an integrated circuit. In an embodiment, the means for providing a first erase voltage from the voltage generator sequentially to NAND channels in a block in each of the planes during a first loop of an erase procedure of a group of memory cells in each of the plurality of the blocks performs steps 1006 and 1010 process 1000 of FIG. 10. In an embodiment, the means for providing a first erase voltage from the voltage generator sequentially to NAND channels in a block in each of the planes during a first loop of an erase procedure of a group of memory cells in each of the plurality of the blocks performs steps 1202-1206 of process 1200 of FIG. 12A. In an embodiment, the means for providing a first erase voltage from the voltage generator sequentially to NAND channels in a block in each of the planes during a first loop of an erase procedure of a group of memory cells in each of the plurality of the blocks performs steps 1222-1226 of process 1200 of FIG. 12B. In an embodiment, the means for providing a first erase voltage from the voltage generator sequentially to NAND channels in a block in each of the planes during a first loop of an erase procedure of the plurality of the blocks performs steps 1242-1250 of process 1240 of FIG. 12C.

In an embodiment, the means for testing sequentially the block in each of the planes for leakage current while only NAND channels in a selected block receive the first erase voltage during the first loop of the erase procedure comprises one or more of memory controller 120, system control logic 260, state machine 262, power control 264, column control circuitry 210, row control circuitry 220, voltage generator 704, leakage detector 808, a processor, an FPGA, an ASIC, and/or an integrated circuit. In an embodiment, the means for testing sequentially the block in each of the planes for leakage current while only NAND channels in a selected block receive the first erase voltage during the first loop of the erase procedure performs steps 1006-1020 of process 1000 in FIG. 10. In an embodiment, the means for testing sequentially the block in each of the planes for leakage current while only NAND channels in a selected block receive the erase voltage during the first loop of the erase procedure performs steps 1208-1214 of process 1200 in FIG. 12A. In an embodiment, the means for testing sequentially the block in each of the planes for leakage current while only NAND channels in a selected block receive the first erase voltage during the first loop of the erase procedure performs steps 1228-1234 of process 1220 in FIG. 12B. In an embodiment, the means for testing sequentially the block in each of the planes for leakage current while only NAND channels in a selected block receive the first erase voltage during the first loop of the erase procedure performs steps 1252-1258 of process 1240 in FIG. 12C.

In an embodiment, the means for providing one or more additional erase voltages from the voltage generator simultaneously to NAND channels in only those blocks that pass the leakage current test during a corresponding one or more additional loops of the erase procedure comprises one or more of memory controller 120, system control logic 260, state machine 262, power control 264, column control circuitry 210, row control circuitry 220, voltage generator 704, a processor, an FPGA, an ASIC, and/or an integrated circuit. In an embodiment, the means for providing one or more additional erase voltages from the voltage generator simultaneously to NAND channels in only those blocks that pass the leakage current test during a corresponding one or more additional loops of the erase procedure performs steps 1026-1028 of process 1000 in FIG. 10. In an embodiment, the means for providing one or more additional erase voltages from the voltage generator simultaneously to NAND channels in only those blocks that pass the leakage current test during a corresponding one or more additional loops of the erase procedure performs process 600 in FIG. 6 in parallel in only those blocks that pass the leakage current test.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a voltage generator configured to generate an erase voltage; and
one or more control circuits in communication with the voltage generator, the one or more control circuits configured to connect to non-volatile memory cells arranged as NAND strings, wherein the non-volatile memory cells are arranged in erase blocks, wherein the one or more control circuits are configured to:
apply a first erase voltage from the voltage generator sequentially to a plurality of the erase blocks during a first loop of an erase procedure of the plurality of the erase blocks;
perform a leakage current test sequentially for each respective block of the erase blocks during the first loop while the first erase voltage is applied to the respective erase block under test; and
perform one or more additional loops of the erase procedure with only those erase blocks that pass the leakage current test simultaneously receiving a corresponding one or more additional erase voltages from the voltage generator.

2. The apparatus of claim 1, wherein the leakage test comprises the one or more control circuits:
applying the first erase voltage to channels of the memory cells in a selected erase block of the plurality of the erase blocks; and
determining whether a magnitude of the first erase voltage after applying the first erase voltage to the channels is below a threshold.

3. The apparatus of claim 2, wherein the one or more control circuits are further configured to:
apply an erase enable voltage to control gates of the memory cells of the selected erase block while the first erase voltage is applied to the channels of the memory cells of the selected erase block.

4. The apparatus of claim 2, wherein applying the first erase voltage to the channels of the memory cells in the selected erase block comprises the one or more control circuits:
applying the first erase voltage to bit lines associated with the NAND strings of the selected erase block; and
applying a select voltage to select transistors on the NAND strings to connect the NAND channels of the memory cells to the bit lines.

5. The apparatus of claim 2, wherein applying the first erase voltage to the channels of the memory cells in the selected erase block comprises the one or more control circuits:
applying the first erase voltage to one or more source lines associated with the NAND strings of the selected erase block; and
applying a select voltage to select transistors on the NAND strings to connect the NAND channels of the memory cells to the one or more source lines.

6. The apparatus of claim 5, wherein the one or more control circuits are further configured to:
apply the first erase voltage to the one or more source lines through a local interconnect that is adjacent to word lines in the selected erase block that connect to the memory cells in the selected erase block.

7. The apparatus of claim 1, wherein the one or more control circuits are further configured to:
apply the first erase voltage from the voltage generator simultaneously to the plurality of the erase blocks during the first loop of the erase procedure, wherein the leakage current test is performed after the first erase voltage is applied simultaneously to the plurality of the erase blocks and without lowering the first erase voltage to a steady state voltage.

8. The apparatus of claim 7, wherein the first erase voltage is a dummy erase voltage that has a lower magnitude than the one or more additional erase voltages applied during the corresponding one or more additional loops and does not erase the memory cells.

9. The apparatus of claim 7, wherein the first erase voltage is a dummy erase voltage that has a shorter duration than a duration of one or more additional erase voltages applied during the corresponding one or more additional loops.

10. The apparatus of claim 1, wherein the one or more control circuits:
do not perform an erase verify in the first loop; and
perform an erase verify for each of the one or more additional loops.

11. A non-volatile storage system comprising:
a memory die comprising a plurality of planes, each plane comprising blocks, each block comprising NAND strings comprising memory cells, each block comprising word lines connected to the memory cells of the NAND strings, each plane comprising bit lines associated with first ends of the NAND strings, each block comprising one or more source lines associated with second ends of the NAND strings;
a voltage generator configured to generate an erase voltage;
means for providing a first erase voltage from the voltage generator sequentially to NAND channels in a block in each of the planes during a first loop of an erase procedure of a group of memory cells in each of the plurality of the blocks;
means for testing sequentially the block in each of the planes for leakage current while only NAND channels in a selected block receive the first erase voltage during the first loop of the erase procedure; and
means for providing one or more additional erase voltages from the voltage generator simultaneously to NAND channels in only those blocks that pass the leakage current test during a corresponding one or more additional loops of the erase procedure.

12. The non-volatile storage system of claim 11, wherein the means for testing sequentially the block in each of the planes for leakage current while only NAND channels in a selected block receive the first erase voltage during the first loop of the erase procedure is configured to:
i) apply the first erase voltage from the voltage generator to the bit lines associated with a first block of the plurality of blocks while applying an erase enable voltage to the word lines of the first block;
ii) apply an erase enable voltage to word lines in the first block;
iii) apply a select voltage to select transistors in the first block to provide the first erase voltage from the bit lines to the channels of the memory cells in the first block;
iv) determine whether a drop in the first erase voltage after the first erase voltage is provided to the channels exceeds a threshold; and
repeat said i), said ii), said iii), and said iv) for each other block of the plurality of blocks.

13. The non-volatile storage system of claim 11, wherein the means for testing sequentially the block in each of the planes for leakage current while only NAND channels in a selected block receive the first erase voltage during the first loop of the erase procedure is configured to:
i) apply the first erase voltage from the voltage generator to the one or more source lines associated with a first block of the plurality of the blocks while applying an erase enable voltage to the word lines of the first block;
ii) apply an erase enable voltage to word lines in the first block;
iii) apply a select voltage to select transistors in the first block to provide the first erase voltage from the one or more source lines to the channels of the memory cells in the first block;
iv) determine whether a drop in the first erase voltage after the first erase voltage is provided to the channels exceeds a threshold; and
repeat said i), said ii), said iii), and said iv) for each other block of the plurality of blocks.

14. The non-volatile storage system of claim 11, wherein the means for providing one or more additional erase voltages from the voltage generator simultaneously to NAND channels in only those blocks that pass the leakage current test during a corresponding one or more additional loops of the erase procedure is configured to:
apply the one or more additional erase voltages from the voltage generator during the corresponding one or more additional loops of the erase procedure to the bit lines associated with only those blocks that pass the leakage current test while applying an erase enable voltage to the word lines of the blocks that pass the leakage current test.

15. The non-volatile storage system of claim 11, wherein the means for providing one or more additional erase voltages from the voltage generator simultaneously to NAND channels in only those blocks that pass the leakage current test during a corresponding one or more additional loops of the erase procedure is configured to:
apply the one or more additional erase voltages from the voltage generator during the corresponding one or more additional loops of the erase procedure to the one or more source lines associated with only those blocks that pass the leakage current test while applying an erase enable voltage to the word lines of the blocks that pass the leakage current test.

16. The non-volatile storage system of claim 11, further comprising:
means for providing the first erase voltage from the voltage generator simultaneously to NAND channels in the plurality of the blocks during the first loop of the erase procedure.

17. The non-volatile storage system of claim 16, wherein the first erase voltage simultaneously applied to the NAND channels during the first loop of the erase procedure has a lower magnitude than the one or more additional erase voltages applied during the corresponding one or more additional loops and does not erase the memory cells.

18. A method for erasing NAND memory cells, the method comprising:
applying a first erase voltage from a voltage generator sequentially to a plurality of erase blocks during a first loop of an erase procedure of the plurality of the erase blocks;
performing a leakage current test sequentially for each respective block of the erase blocks during the first loop while the first erase voltage is applied to the respective erase block under test; and
performing one or more additional loops of the erase procedure with only those erase blocks that pass the leakage current test simultaneously receiving a corresponding one or more additional erase voltages from the voltage generator.

* * * * *